(12) United States Patent
Uezawa et al.

(10) Patent No.: US 9,564,592 B2
(45) Date of Patent: Feb. 7, 2017

(54) ORGANIC ELECTROLUMINESCENT ELEMENT, METHOD FOR MANUFACTURING ORGANIC ELECTROLUMINESCENT ELEMENT, AND ORGANIC ELECTROLUMINESCENT MODULE

(71) Applicant: Konica Minolta, Inc., Tokyo (JP)

(72) Inventors: Kuniaki Uezawa, Tokyo (JP); Natsuki Yamamoto, Kanagawa (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/894,829

(22) PCT Filed: May 20, 2014

(86) PCT No.: PCT/JP2014/063313
§ 371 (c)(1),
(2) Date: Nov. 30, 2015

(87) PCT Pub. No.: WO2014/192589
PCT Pub. Date: Dec. 4, 2014

(65) Prior Publication Data
US 2016/0111646 A1    Apr. 21, 2016

(30) Foreign Application Priority Data

May 30, 2013  (JP) ................. 2013-113573

(51) Int. Cl.
*H01L 51/00* (2006.01)
*C09K 11/06* (2006.01)
(Continued)

(52) U.S. Cl.
CPC .......... *H01L 51/0018* (2013.01); *C09K 11/06* (2013.01); *G02B 5/08* (2013.01); *G02B 5/22* (2013.01);
(Continued)

(58) Field of Classification Search
CPC ............ H01L 51/0018; H01L 27/3209; H01L 27/3239; H01L 27/3244; H01L 51/5271; H01L 51/5278; H01L 51/5281; H01L 51/5284; H01L 51/56; C09K 11/06; G02B 5/08; G02B 5/22; G02B 5/30
See application file for complete search history.

(56) References Cited

U.S. PATENT DOCUMENTS 8,330,724 B2    12/2012  Kim
2002/0130615 A1*  9/2002  Saito .................. H01L 51/5203
                                                                313/506
2007/0001588 A1   1/2007  Boroson et al.

FOREIGN PATENT DOCUMENTS

JP    H04-255692 A    9/1992
JP    H08-315985 A    11/1996
(Continued)

OTHER PUBLICATIONS

International Search Report issued in corresponding application No. PCT/JP2014/063313 mailed Jul. 29, 2014 (4 pages).
(Continued)

*Primary Examiner* — Karen Kusumakar
(74) *Attorney, Agent, or Firm* — Osha Liang LLP

(57) ABSTRACT

An organic electroluminescent element includes a support substrate having thereon at least two light emitting units each containing one or a plurality of organic functional layers and at least one intermediate metal layer having a light-transmitting property. The intermediate metal layer is arranged between the light emitting units. At least one organic functional layer in each light emitting unit has a region wherein a light emission function is modulated and another region wherein the light emission function is not modulated by being patterned with a mask during the step of forming the organic functional layer, and by being additionally patterned by light irradiation after formation of the
(Continued)

organic functional layer. The at least two light emitting units are able to be electrically driven independently or simultaneously.

6 Claims, 3 Drawing Sheets

(51) Int. Cl.
G02B 5/08 (2006.01)
G02B 5/22 (2006.01)
G02B 5/30 (2006.01)
H01L 27/32 (2006.01)
H01L 51/52 (2006.01)
H01L 51/56 (2006.01)

(52) U.S. Cl.
CPC ............ *G02B 5/30* (2013.01); *H01L 27/3209* (2013.01); *H01L 27/3239* (2013.01); *H01L 27/3244* (2013.01); *H01L 51/5271* (2013.01); *H01L 51/5278* (2013.01); *H01L 51/5281* (2013.01); *H01L 51/5284* (2013.01); *H01L 51/56* (2013.01); *C09K 2211/1011* (2013.01); *C09K 2211/1014* (2013.01); *C09K 2211/1029* (2013.01); *C09K 2211/1033* (2013.01); *C09K 2211/1044* (2013.01); *C09K 2211/1048* (2013.01); *C09K 2211/1059* (2013.01); *C09K 2211/1088* (2013.01); *C09K 2211/185* (2013.01); *H01L 2227/323* (2013.01)

(56) References Cited

FOREIGN PATENT DOCUMENTS

| JP | 2005-099309 A | | 4/2005 |
|----|---------------|---|--------|
| JP | 2009-500794 A | | 1/2009 |
| JP | 2010-027584 | * | 2/2010 |
| JP | 2010-027584 A | | 2/2010 |
| JP | 2011-034884 A | | 2/2011 |
| WO | 2013/011599 A1 | | 1/2013 |

OTHER PUBLICATIONS

Written Opinion of the International Searching Authority issued in corresponding application No. PCT/JP2014/063313 mailed Jul. 29, 2014 (4 pages).
International Preliminary Report on Patentability and Written Opinion issued in corresponding International Application No. PCT/JP2014/063313, mailed Dec. 10, 2015 (11 pages).
Office Action issued in corresponding Korean Application No. 10-2015-7033456 dated Sep. 29, 2016, and English translation thereof (7 pages).

\* cited by examiner

ORGANIC ELECTROLUMINESCENT ELEMENT, METHOD FOR MANUFACTURING ORGANIC ELECTROLUMINESCENT ELEMENT, AND ORGANIC ELECTROLUMINESCENT MODULE

TECHNICAL FIELD

The present invention relates to an organic electroluminescent element, a production method of an organic electroluminescent element, and an organic electroluminescent module. In particular, the present invention relates to an organic electroluminescent element provided with a light-emitting pattern enabling to change a light-emitting pattern of high form accuracy without emission unevenness, a production method of an organic electroluminescent element, and an organic electroluminescent module.

BACKGROUND

In recent years, a light emitting diode (LED) using a light guide panel and an organic light emitting diode (OLED, hereafter, it is also called as an organic electroluminescent element) have been attracted attentions as a flat panel light source. An LED with a light guide panel has been used not only for a general illumination, but for various situations and purposes such as a backlight for a liquid crystal display (LCD) (for example, refer to Patent Document 1).

In particular, the production volume of smart devices (smart phones and tablets) has been increased since around the year of 2008. An LED with a light guide panel is used for them. A main use thereof is for a backlight. As other use, an LED with a light guide panel has been incorporated in many cases as a backlight for common function key buttons located in the lower portion of a device.

In many cases, three kinds of marks: home (indicated by a square mark); return (indicated by an arrow mark); and search (indicated by a magnifier mark), are mainly used for common function key buttons.

These common function key buttons have a composition as follows. Generally, a pattern of a required mark is printed on a cover glass. Then, the above-described LED with a light guide panel is placed inside of the cover glass. An LED emits light according to the required situation and the emitted light is guided through the light guide panel (film). The light is taken out to the display side through the light diffusing member having a dot shape and printed on a patterned portion.

However, there are several problems to realize emission of light of the above-described common function key buttons by using an LED light guide panel system.

One of the problems is as follows. The light guide panel (film) is required to be thin since the location space of an LED is limited. When the light guide panel becomes thin, the efficiency of the device with respect to the emission efficiency of the LED light source becomes low.

Another one of the problems is as follows. Since the light is guided from the side of key display, it may produce unevenness of luminance depending on a design or a shape of a key button. When it is intended to solve this unevenness of luminance, it is required to increase the number of the LED sources. This will lead to an increase of cost and an increase of electric power consumption.

Another one of the problems is as follows. It cannot achieve the change of key display corresponding to the situations. When it is intended to realize this, it will result in the composition of laminating a plurality of LED light guide units. This will lead to an increase of thickness and an increase of cost.

Therefore, at present situation, the display of common function key buttons is limited to one kind regardless of the situations. Moreover, it is limited to the key units having pronounced emission unevenness and easily observed the dot shape for guiding light.

There are user's needs of a new common function key unit which enables to solve the above-described three problems. For example, it can suitably change the direction of an arrow mark, it can obtain a uniform light emission without emission unevenness, and it cannot observe the shape of the arrow mark when unlighted. At the present time, these cannot be achieved with an LED having a light guide panel system.

It is possible to form a shape corresponding to the key display by making pattering with a mask during the film forming process of an organic electroluminescent element (organic EL element). However, it was not possible to produce a light-emitting pattern which enables to change an arbitral mark shape at the identical place according to the situation display.

Further, there was a problem that the resolution was insufficient only by making pattering with a mask during the film forming process.

PRIOR ART DOCUMENT

Patent Document

Patent Document 1: U.S. Pat. No. 8,330,724

SUMMARY OF THE INVENTION

Problems to be Solved by the Invention

The present invention has been made in view of the above-described problem and situation. An object of the present invention is to provide an organic electroluminescent element enabling to change a light-emitting pattern of high form accuracy without emission unevenness, a production method of the organic electroluminescent element, and further, an organic electroluminescent module having the organic electroluminescent element.

Means to Solve the Problems

The present inventors have investigated the reasons of the above-described problems, and have found the following and achieved the invention. At least one of organic functional layers in each light emitting unit is patterned with a mask during the formation of the organic functional layer. Further, after formation of the organic functional layer, patterning is done with light irradiation to form a region wherein a light emission function is modulated and another region wherein the light emission function is not modulated. The organic electroluminescent element thus produced enables to keep a pattern of high form accuracy without emission unevenness, and it enables to change the light-emitting pattern.

That is, the above-described problems according to the present invention are solved by the following means.

1. An organic electroluminescent element comprising a support substrate having thereon: at least two light emitting units each containing one or a plurality of organic functional layers; and at least one intermediate metal layer having a light-transmitting property, the intermediate metal layer being arranged between the light emitting units, wherein at least one organic functional layer in each light emitting unit has a region wherein a light emission function is modulated and another region wherein the light emission function is not modulated by being patterned with a mask during the step of forming the organic functional layer, and by being additionally patterned by light irradiation after formation of the organic functional layer; and the at least two light emitting units are able to be electrically driven independently or simultaneously.

2. An organic electroluminescent element described in the item 1, wherein the at least one organic functional layer is a hole transport layer or a hole injection layer.

3. A method for producing an organic electroluminescent element comprising a support substrate having thereon: at least two light emitting units each containing one or a plurality of organic functional layers; and at least one intermediate metal layer having a light-transmitting property, the intermediate metal layer being arranged between the light emitting units, the method comprising the steps of:

pattering at least one organic functional layer in each light emitting unit with a mask; and laying out a region wherein a light emission function is modulated and another region wherein the light emission function is not modulated by irradiation with light.

4. A method for producing an organic electroluminescent element described in the item 3, wherein the at least one organic functional layer is a hole transport layer or a hole injection layer.

5. An organic electroluminescent module having an organic electroluminescent element described in the items 1 or 2.

6. An organic electroluminescent module described in the item 5, wherein a polarizing member, a half mirror member, or a black filter is provided on a light emitting surface side of the support substrate.

Effects of the Invention

By the above-described means of the present invention, it is possible to provide an organic electroluminescent element enabling to change a light-emitting pattern of high form accuracy without emission unevenness, and a production method of the organic electroluminescent element, and further, an organic electroluminescent module provided with the organic electroluminescent element.

EMBODIMENTS TO CARRY OUT THE INVENTION

An organic electroluminescent element of the present invention includes a support substrate having thereon: at least two light emitting units each containing one or a plurality of organic functional layers; and at least one light-transmitting intermediate metal layer, the intermediate metal layer being arranged between the light emitting units, wherein at least one organic functional layer in each light emitting unit has a region wherein a light emission function is modulated and another region wherein the light emission function is not modulated by being mask patterned during the step of forming the organic functional layer, and by being additionally patterned by light irradiation after the forming of the organic functional layer; and at least the two light emitting units are able to be electrically driven independently or simultaneously. This feature is a common technical feature of the invention according to the claim 1 to claim 6.

A preferable embodiment of the present invention is that at least one organic functional layer is a hole transport layer or a hole injection layer from the viewpoint of increasing a masking accuracy.

A method for producing an organic EL element of the present invention is characterized in that it contains a step of pattering at least one organic functional layer in each light emitting unit with a mask; and a step of laying out a region wherein a light emission function is modulated and another region wherein the light emission function is not modulated by irradiation with light.

A preferable embodiment of the present invention is that at least one organic functional layer is a hole transport layer or a hole injection layer from the viewpoint of increasing a masking accuracy.

An organic EL element of the present invention is appropriately included in an organic EL module. A preferable embodiment of the present invention is that it contains a polarizing member, a half mirror member, or a black filter on a light emitting surface side of the support substrate from the viewpoint of achieving black when unlighted.

The present invention and the constitution elements thereof, as well as configurations and embodiments to carry out the present invention, will be detailed in the following. In the present description, when two figures are used to indicate a range of value before and after "to", these figures are included in the range as a lowest limit value and an upper limit value.

<<Constitution of Organic EL Element>>

Preferable examples of a constitution of an organic EL element of the present invention are described below. However, the present invention is not limited to them.

Figure 1:
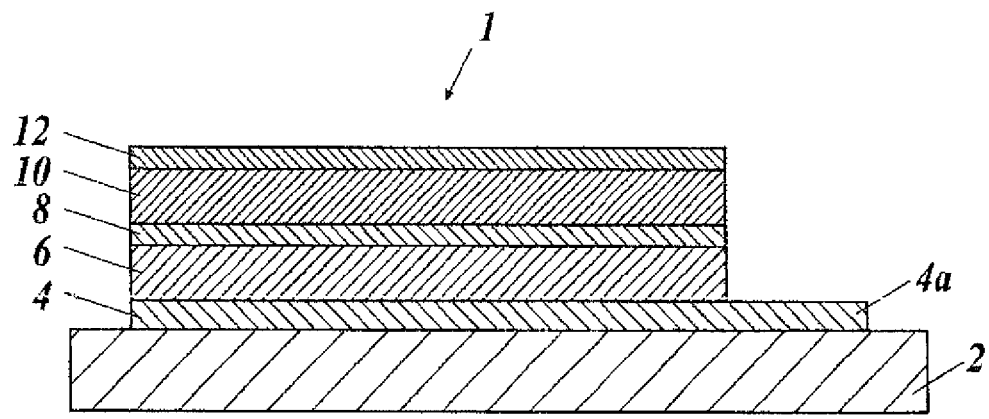
FIG. 1 is a schematic cross sectional view illustrating an example of an organic EL element.

(I) Anode/first light emitting unit/intermediate metal layer/second light emitting unit/cathode (II) Anode/first light emitting unit/first intermediate metal layer/second light emitting unit/second intermediate metal layer/third light emitting unit/cathode (I-1) Anode/white light emitting unit/intermediate metal layer/white light emitting unit/cathode (II-1) Anode/white light emitting unit/first intermediate metal layer/white light emitting unit/second intermediate metal layer/white light emitting unit/cathode As an example of an organic EL element of the present invention, an organic EL element having the above-described constitution (I) is illustrated in FIG. 1.

As illustrated in FIG. 1, an organic EL element 1 is constituted by sequentially laminated on a support substrate 2 with a anode 4, a light emitting unit 6, an intermediate metal layer 8, a light emitting unit 10, and a cathode 12.

On a side edge portion of the support substrate 2, the anode 4 is pulled out to form a taking-out electrode 4a. The intermediate metal layer 8 has a light transmitting property.

In the present invention, a sufficient number of light emitting units is 2 or more, and there is no limitation. However, by considering the production efficiency, a preferable number is in the range of 2 to 10, and a more preferable number is in the range of 2 to 3. Here, when a number of light emitting units is N (N is an integer of 2 or more), a number of intermediate metal layers is (N−1).

Preferable examples of a constitution of a light emitting unit are described below. However, the present invention is not limited to them.
(i) Hole injection transport layer/light emitting layer/electron injection transport layer
(ii) Hole injection transport layer/light emitting layer/hole blocking layer/electron injection transport layer
(iii) Hole injection transport layer/electron blocking layer/light emitting layer/hole blocking layer/electron injection transport layer
(iv) Hole injection layer/hole transport layer/light emitting layer/electron transport layer/electron injection layer
(v) Hole injection layer/hole transport layer/light emitting layer/hole blocking layer/electron transport layer/electron injection layer
(vi) Hole injection layer/hole transport layer/electron blocking layer/light emitting layer/hole blocking layer/electron transport layer/electron injection layer In the present invention, light emitting units having a different constitution may be used in combination. However, it is preferable to use the light emitting units having the same layer constitution and the same materials except the light emitting layer which constitutes the light emitting unit. Further, it is preferable that the number of the light emitting layers is the same. By this, it can reduce the number of the employed substances. This will produce a merit of cost and quality control. Moreover, when a vapor deposition process is employed, the film forming chamber can be commonly used for each light emitting unit. Thus, a merit of production efficiency will be benefited.

From the same reason as described above, it is particularly preferable that all of the layer constitution including the light emitting layer and all of the substances are the same.

Each layer which constitutes a light emitting unit is formed with known thin film forming methods such as: a vapor deposition method, a spin coating method a cast method, an LB (Langmuir-Blodgett method) method, an inkjet method, a spray method, a printing method, and a slot type coater method.

In the following, each layer which constitutes an organic EL element of the present invention will be described.

<Intermediate Metal Layer (8)>

An intermediate metal layer of the present invention is arranged between two light emitting units, and it has a light transmitting property.

An intermediate metal layer may have a state in which a film made of metal substance is not formed in a part of the fine region and to form a pinhole or a mesh structure in the plane direction of the layer. Otherwise, an intermediate metal layer forming portion may form an island shape (macule).

In the intermediate metal layer of the present invention, a metal having a work function of 3.0 eV or less is employed.

Examples of a substance used in the intermediate metal layer are: calcium (work function: 2.87 eV; melting point: 1112.2 K), lithium (do.: 2.9 eV; do.: 453.7 K), sodium (do.: 2.75 eV; do.: 371 K), potassium (do.: 2.3 eV; do.: 336.9 K), cesium (do.: 2.14 eV; do.: 301.6 K), rubidium (do.: 2.16 eV; do.: 312.1 K), barium (do.: 2.7 eV; do.: 998.2 K), and strontium (do.: 2.59 eV, do.: 1042.2 K). Among them, lithium, calcium and barium are preferable. These substances have a melting point at normal pressure of 400 K or more and they will hardly deteriorate the performance of an organic EL element at a high temperature.

A thickness of an intermediate metal layer is preferably in the range of 0.6 to 5 nm, more preferably, in the range of 0.8 to 3 nm, and still more preferably, in the range of 0.8 to 2 nm.

When a thickness of an intermediate metal layer is 5 nm or less, it will inhibit deterioration in efficiency of an organic EL element due to light absorption of the metal substance employed. And, there will be no deterioration in storage stability and driving stability of an organic EL element.

On the other hand, when a thickness of an intermediate conductive layer is 0.6 nm or more, it will result in increased property stability, in particular, it will result in achieving small property change in the early stage after production of an element.

In addition, "a thickness of an intermediate metal layer" of the present invention is defined as "an average thickness" which is calculated by dividing the formed film mass per unit area with a density of the material. Consequently, it does not matter whether a thickness of an intermediate metal layer at an arbitral portion is larger or smaller compared with "an average thickness".

In the present invention, from the viewpoint of avoiding deterioration of the conductivity in the voltage application direction of the intermediate metal layer, and controlling the conductivity in in-plane direction, it is preferable that at least one of the surfaces of the intermediate metal layer is formed as a non-flat surface instead of the case in which a surface of the intermediate metal layer facing the light emitting unit has a complete flat surface. When the intermediate metal layer has a non-flat surface, this indicates that the shape of the intermediate metal layer in the in-plane direction has a mesh structure or an island structure.

In addition, it is preferable that a layer adjacent to the intermediate metal layer and located in the side of the anode is formed with a film formation using a single organic compound. This makes the production process to be simple and can easily control the production process. Further, it is preferable since it can reduce the risk of property variation caused by using a plurality of materials, and it will result in excellent long term stability, high temperature stability or long term driving stability.

It is preferable that the layer adjacent to the intermediate metal layer has a function (between the light emitting unit located in the side of the cathode and the light emitting unit located in the side of the anode via the intermediate metal layer) of giving and receiving a charge or injecting a charge to each light emitting unit. As a layer having such function, in order to increase a charge transport property, it is preferable to form a mixture layer composed of a charge transporting organic compound with an inorganic material or an organic metal complex which can oxidize or reduce the organic compound, or can form a charge transfer complex.

<Light Emitting Layer>

It is preferable that a light emitting layer contains a host compound and a light emitting dopant. The light emitting dopant contained in the light emitting layer may be uniformly included in the thickness direction of the light emitting layer, or it may be included in a manner having a density gradient.

A thickness of each light emitting layer in each light emitting unit is not specifically limited. From the viewpoint of obtaining uniformity of the formed layer, preventing unnecessary high voltage application at the time of light emission and achieving improvement of emission color with respect to the driving voltage, it is preferable that the thickness of each light emitting layer is adjusted in the range of 5 to 200 nm, and more preferably, it is adjusted in the range of 10 to 100 nm.

In the following, a phosphorescent host compound and a phosphorescent dopant contained in the light emitting layer will be described.

(1) Phosphorescent Host Compound

A structure of a phosphorescent host compound used for the present invention is not particularly limited. Representative compounds include those having a basic skeleton such as: carbazole derivatives, triarylamine derivatives, aromatic borane derivatives, nitrogen-containing heterocyclic compounds, thiophene derivatives, furan derivatives, oligoarylene compounds, carboline derivatives, or diazacarbazole derivatives (here, "a diazacarbazole derivative" indicates a ring structure in which at least one of the carbon atoms constituting the carboline ring is replaced with a nitrogen atom).

A phosphorescent host compound may be used singly, or a plurality of phosphorescent host compounds may be used together.

A phosphorescent host compound used in a light emitting layer of the present invention is preferably a compound represented by Formula (a).

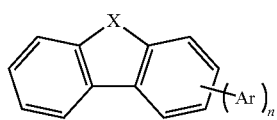

Formula (a)

In Formula (a), "X" represents NR', O, S, CR'R", or SiR'R". R' and R" each independently represent a hydrogen atom or a substituent. "Ar" represents an aromatic ring. "n" is an integer of 0 to 8.

With respect to "X" in Formula (a), examples of a substituent represented by R' or R" include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group, an allyl group, 1-propenyl group, 2-butenyl group, 1,3-butadienyl group, 2-pentenyl group and iso-propenyl group); an alkynyl group (for example, an ethynyl group and a propargyl group); an aromatic hydrocarbon group (also called an aromatic carbon ring group or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyl group); an aromatic heterocyclic group (for example, a furyl group, a thienyl group, a pyridyl group, a pyridazinyl group, a pyrimidinyl group, a pyrazinyl group, a triazinyl group, group, an imidazolyl group, a pyrazolyl group, a thiazolyl group, a quinazolinyl group, a carbazolyl group, a carbolinyl group, a diazacarbazolyl group (indicating a ring structure in which one of the carbon atoms constituting the carboline ring of the carbolinyl group is replaced with nitrogen atoms), and a phthalazinyl group); a heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsdfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group, and a phenyldiethylsilyl group) and a phosphono group.

These substituents may be further substituted by the above-mentioned substituent. Further, a plurality of these substituents may combine with each other to form a ring.

In Formula (a), "X" is preferably NR' or O, and R' is particularly preferable to be an aromatic hydrocarbon ring group or an aromatic heterocyclic group.

In Formula (a), an aromatic ring represented by "Ar" is an aromatic hydrocarbon ring or an aromatic heterocyclic ring.

An aromatic ring represented by "Ar" maybe a single ring or a condensed ring. In addition, it may be unsubstituted or it may have a substituent represented by R' and R".

Examples of an aromatic hydrocarbon ring represented by "Ar" in Formula (a) include: a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring an acenaphthene ring, a coronene ring, a fluorene ring, a fluoroanthrene ring, a naphthacene ring, a pentacene ring, a perylene ring, a pentaphene ring, a picene ring, a pyrene ring, a pyranthrene ring, and an anthraanthrene ring.

Examples of an aromatic heterocyclic ring represented by "Ar" in Formula (a) include: a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, and a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthyridine ring, a carbazole ring, a carboline ring, and a diazacarbazole ring (indicating a ring structure in which one of the carbon atoms constituting the carboline ring is replaced with a nitrogen atom).

Among the above-described rings, preferable rings used for an aromatic ring represented by "Ar" in Formula (a) are a carbazole ring, a carboline ring, a dibenzofuran ring, and a benzene ring. More preferably used rings are a carbazole ring, a carboline ring, and a benzene ring. Most preferably used ring is a benzene ring having a carbazolyl group.

As an aromatic ring represented by "Ar" in Formula (a), one of the preferable embodiments is a condensed ring having three or more rings. Specific examples of a condensed aromatic hydrocarbon ring having three or more rings are: a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzocoronen ring, a hexabenzocoronen ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, coronene ring, a naphthocoronen ring, an ovalene ring, and an anthraanthrene ring.

Specific examples of a condensed aromatic heterocyclic ring having three or more rings are: an acridine ring, a benzoquinoline ring, a carbazole ring, a carboline ring, a phenazine ring, a phenanthridine ring, a phenanthroline ring, a carboline ring, a cycladine ring, a quindoline ring, a tepenidine ring, a quinindoline ring, a triphenodithiazine ring, a triphenodioxazine ring, a phenanthrazine ring, an anthrazine ring, perimidine ring a diazacarbazole ring (indicating a ring structure in which one of the carbon atoms constituting the carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, and a thiophanthrene ring (a naphthothiophene ring).

In Formula (a), n is an integer of 0 to 8. Preferably, n is an integer of 0 to 2. In particular, when "X" represents O or S, n is preferably an integer of 1 or 2.

Specific examples of a phosphorescent host compound represented by Formula (a) are listed in the following, however, the present invention is not limited to them.

1-1

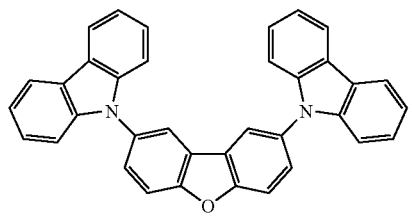

1-2

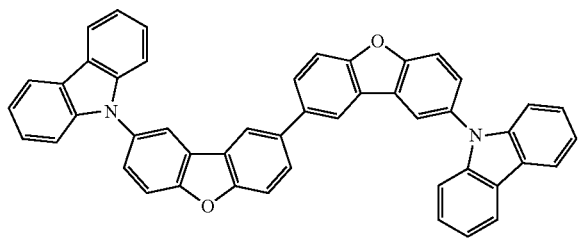

1-3

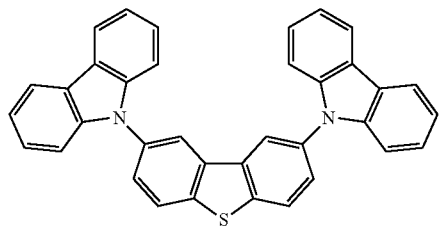

1-4

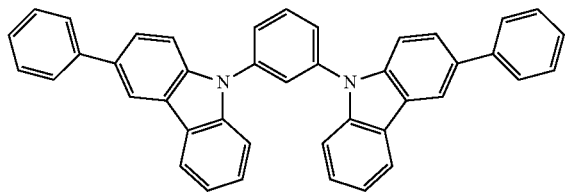

1-5
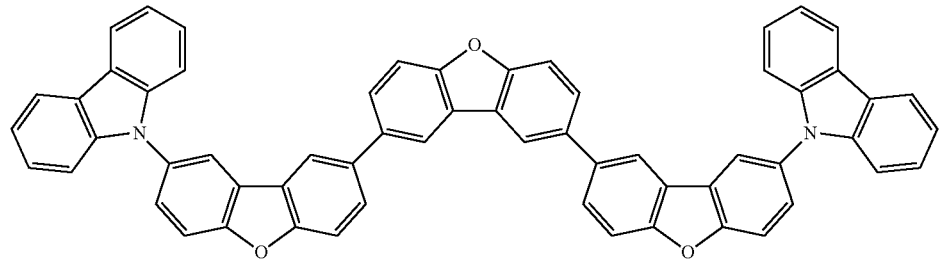
1-6
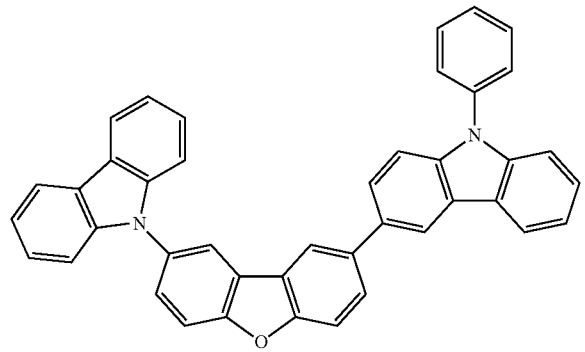
1-7
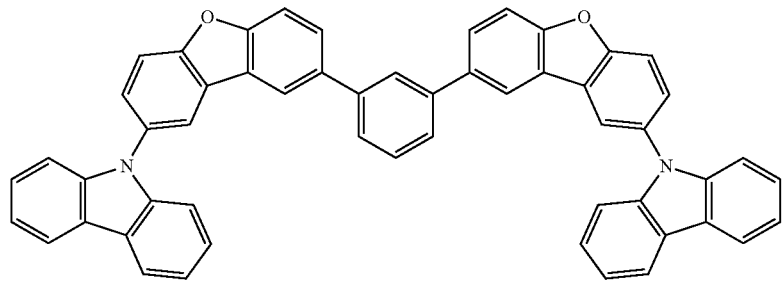
1-8
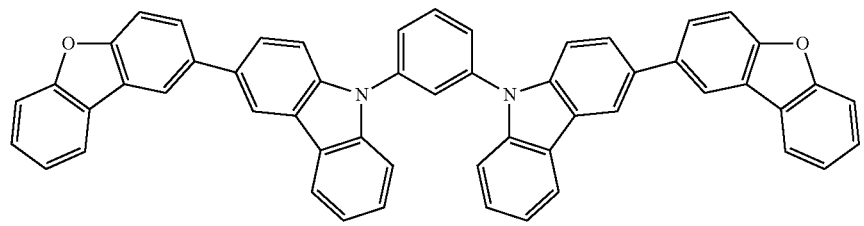
1-9 1-10
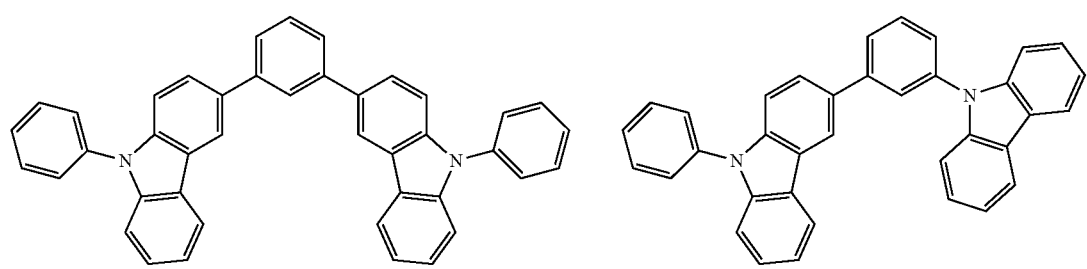

-continued
1-11
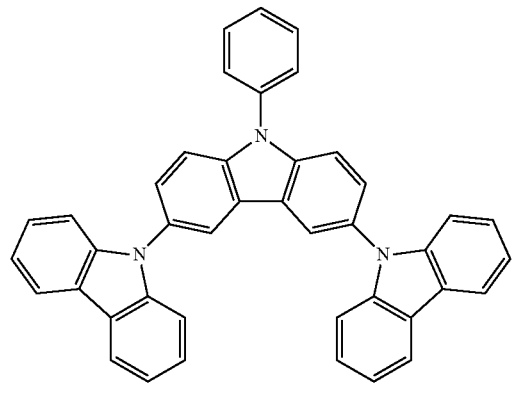
1-12
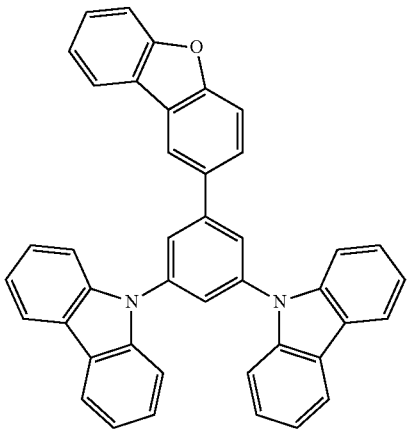
1-13
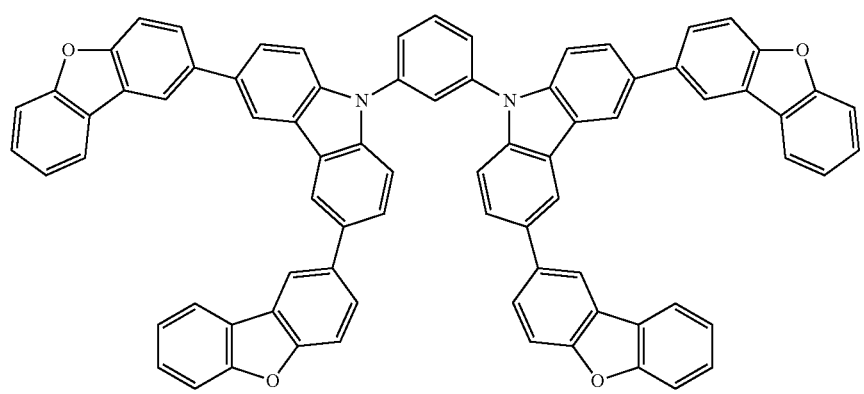
1-14
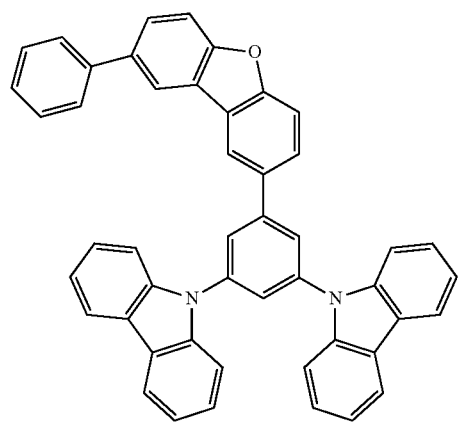
1-15
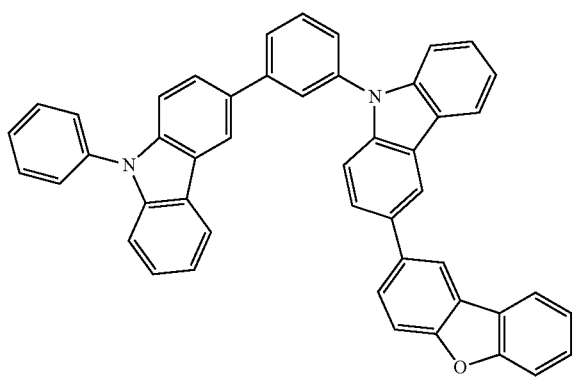
1-16
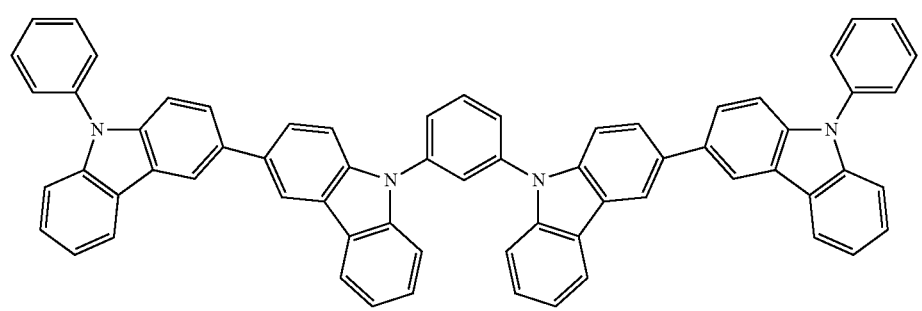

-continued
1-17
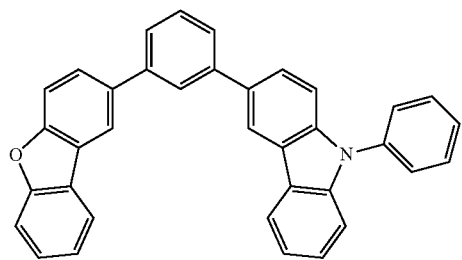
1-18
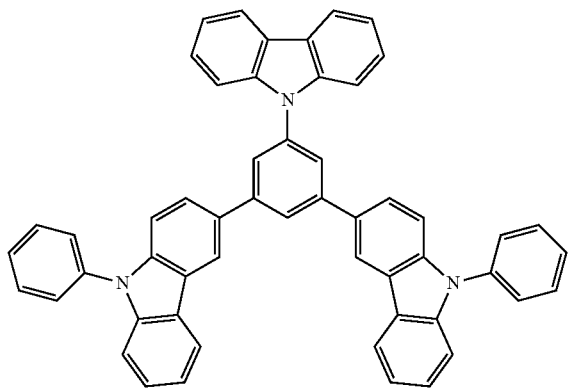
1-19
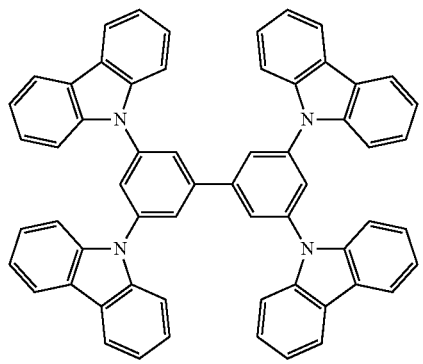
1-20
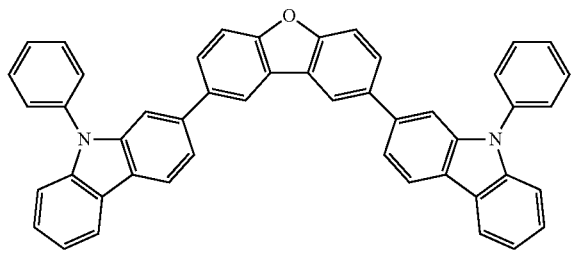
1-21
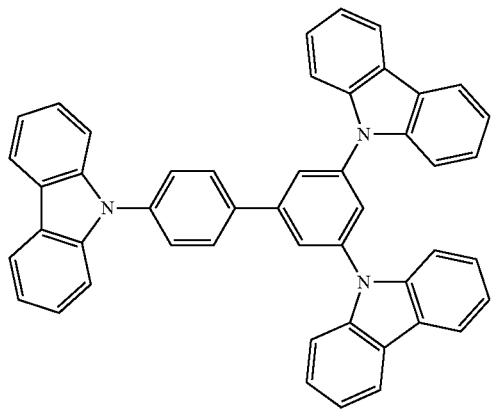
1-22
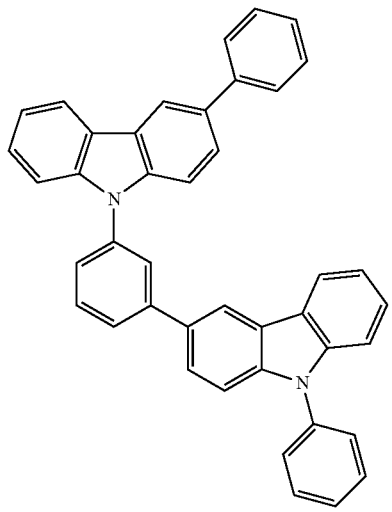
1-23
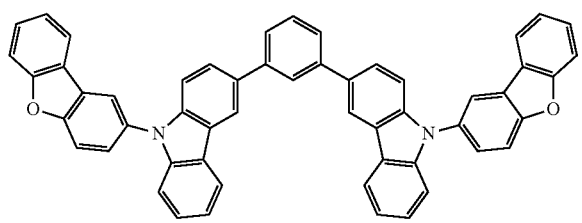
1-24
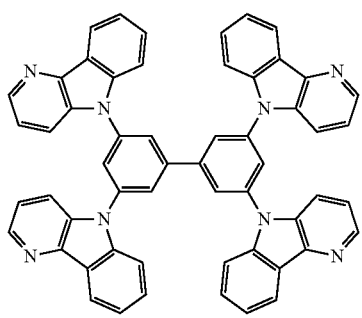

-continued
1-25
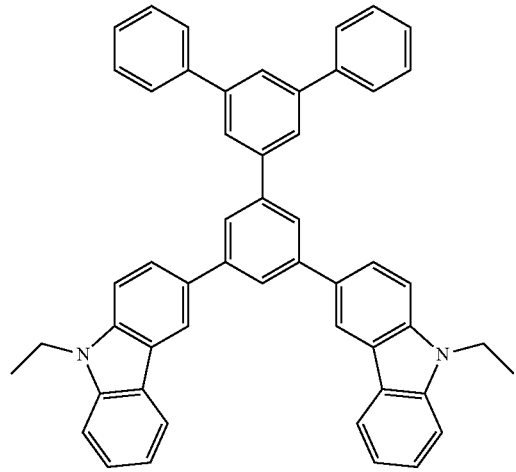
1-26
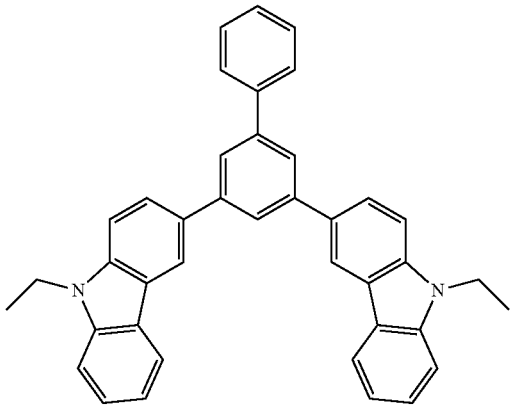
1-27
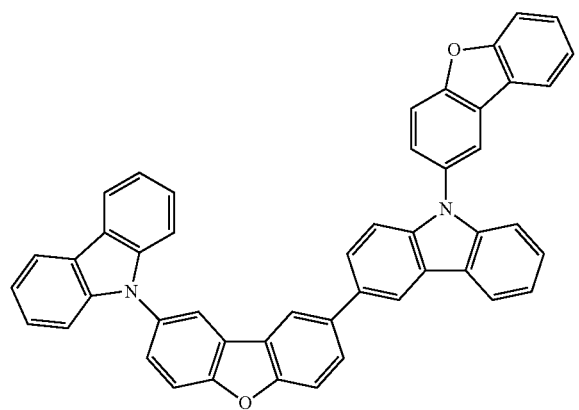
1-28
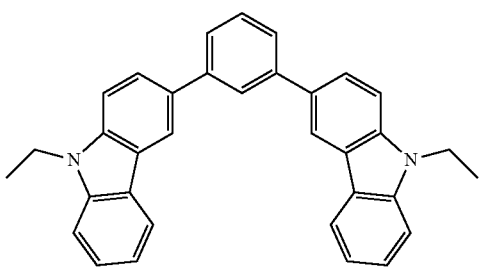
1-29
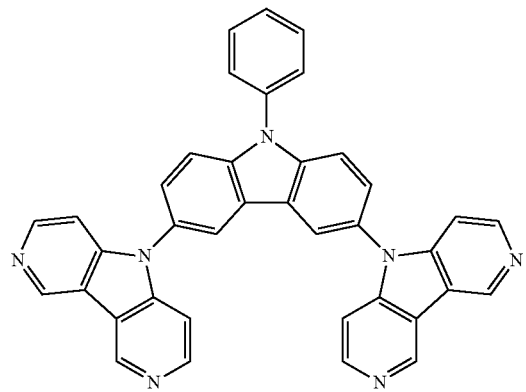
1-30
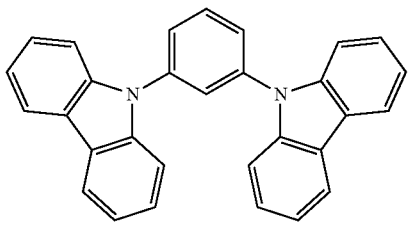

-continued
1-31
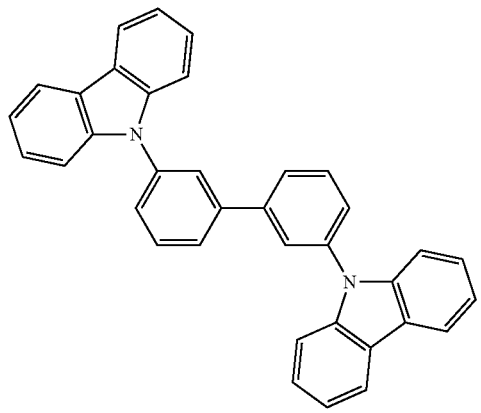
1-32
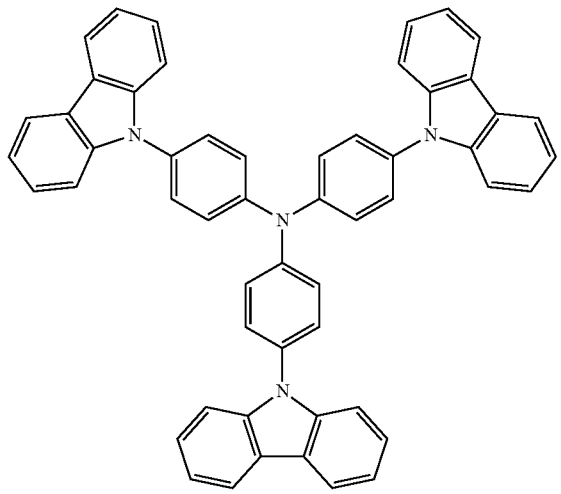
1-33
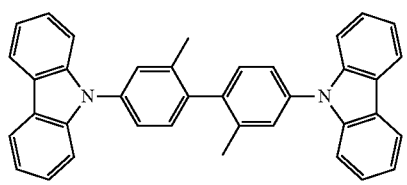
1-34
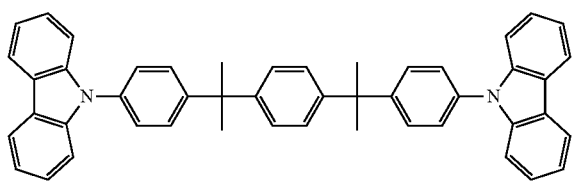
1-35
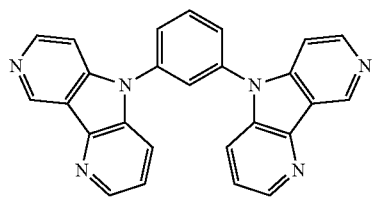
1-36
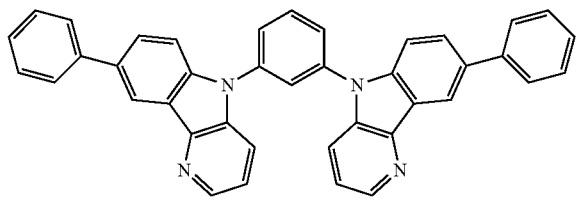
1-37
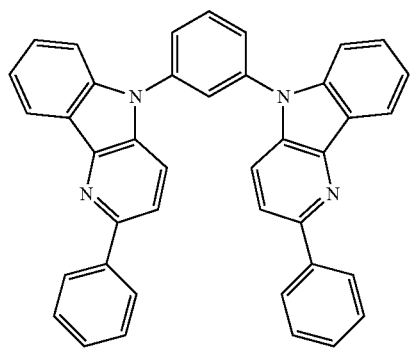
1-38
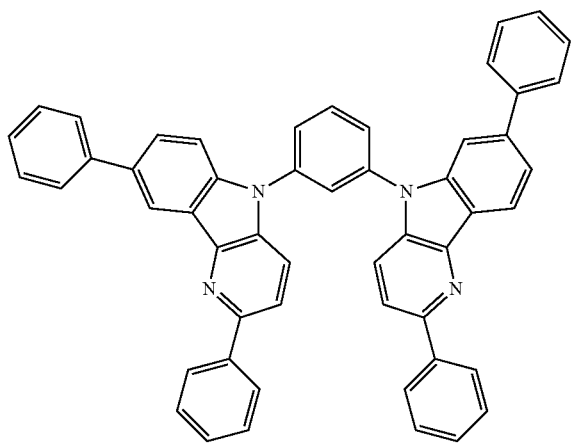

-continued 1-39

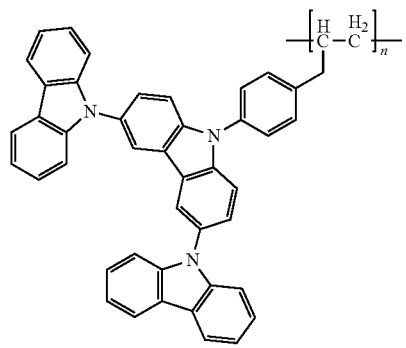

1-40

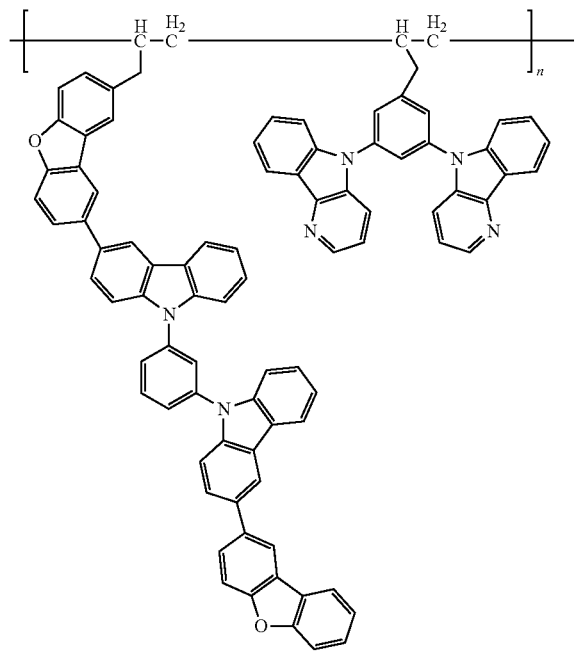

1-41

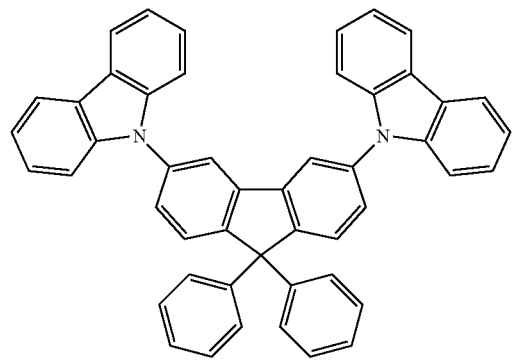

1-42

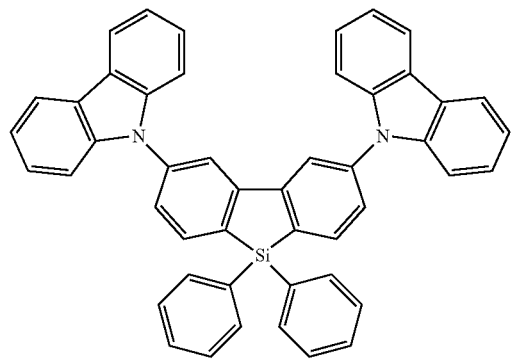

Further, a phosphorescent host compound used in the present invention may be either a low molecular weight compound or a polymer compound having a repeating unit, in addition to a low molecular weight compound provided with a polymerizing group such as a vinyl group and an epoxy group (a vapor deposition polymerizable light emitting host).

It is preferable that the phosphorescent host compound is a compound having properties of hole transport ability and electron transport ability, and at the same time, preventing longer wavelength of emitted light and having a high Tg (glass transition temperature). In the present invention, preferable is a compound having a Tg of 90° C. or more, more preferable is a compound having a Tg of 130° C. or more to obtain an excellent performance.

Here, a glass transition temperature (Tg) is a value obtained with DSC (Differential Scanning Colorimetry) based on the method described in JIS K 7121.

Conventionally known host compounds may be used in the present invention. Specific examples of a known host compound are described in the following documents, and they may be suitably used. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

When an organic EL element of the present invention has a plurality of light emitting layers, a phosphorescent host compound may be different in each light emitting layer. However, it is preferable to use the same compound in view of the production efficiency and production control.

Preferably, a phosphorescent host compound has the lowest excited triple energy level ($T_1$) of 2.7 eV or more to obtain a higher light emitting efficiency.

In the present invention, the lowest excited triple energy level ($T_1$) indicates a peak energy level of a light emitting band corresponding to transition between the lowest vibration bands of the phosphorescent emission spectrum observed at a liquid nitrogen temperature from the host compound dissolved in a solvent.

(2) Phosphorescent Dopant

A phosphorescent dopant usable in the present invention may be selected from the known compounds. Examples thereof are metal complexes containing a metal belonging to groups 8 to 10 in the periodic table. Preferable are an iridium compound, an osmium compound, a platinum compound (platinum complex compound), or a rare earth complex. Among them, most preferable is an iridium compound.

When an organic EL element emitting white light is produced, phosphorescent emission materials are preferably used at least for light emitting substances of green, yellow, and red region.

(Partial Structures Represented by Formulas (A) to (C).

When a blue phosphorescent dopant is used as a phosphorescent dopant, it may be suitably selected from the known compounds used in a light emitting layer of an organic EL element. However, it is preferable that it contains at least one partial structure represented by any one of the following Formulas (A) to (C).

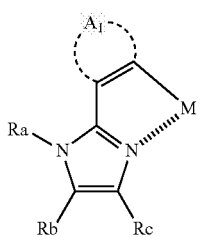

Formula (A)

In Formula (A), "Ra" represents a hydrogen atom, an aliphatic group, an aromatic group, or a heterocyclic group. "Rb" and "Rc" each independently represent a hydrogen atom or a substituent. "A1" represents a residue which is necessary to form an aromatic group or a heterocyclic group. "M" represents Ir or Pt.

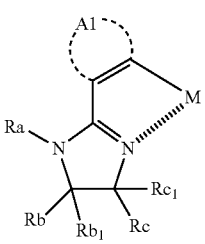

Formula (B)

In Formula (B), "Ra" represents a hydrogen atom, an aliphatic group, an aromatic group, or a heterocyclic group. "Rb", "Rc", "Rb$_1$" and "Rc$_1$" each independently represent a hydrogen atom or a substituent. "A1" represents a residue which is necessary to form an aromatic group or a heterocyclic group. "M" represents Tr or Pt.

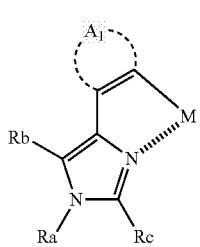

Formula (C)

In Formula (C), "Ra" represents a hydrogen atom, an aliphatic group, an aromatic group, or a heterocyclic group. "Rb" and "Rc" each independently represent a hydrogen atom or a substituent. "A1" represents a residue which is necessary to form an aromatic group or a heterocyclic group. "M" represents Ir to Pt.

Examples of an aliphatic group represented by "Ra" in Formulas (A) to (C) are: an alkyl group (for example, a methyl group, an ethyl group, a propyl group, a butyl group, a pentyl group, an iso-pentyl group, a 2-ethyl-hexyl group, an octyl group, an undecyl group, a dodecyl group, and a tetradecyl group); a cycloalkyl group (for example, a cyclopentyl group and a cyclohexyl group); an aryl group (for example, a phenyl group, a tolyl group, an azulenyl group, an anthranyl group, a phenanthryl group, a pyrenyl group, a chrysenyl group, a naphthacenyl group, an o-terphenyl, a m-terphenyl group, a p-terphenyl group, an acenaphthenyl group, a coronenyl group, a fluorenyl group, and a perylenyl group); a heterocyclic group (for example, a pyrrolyl group, an indolyl group, a furyl group, a thienyl group, an imidazolyl group, a pyrazolyl group, an indolizinyl group, a quinolinyl group, a carbazolyl group, an indolinyl group, a thiazolyl group, a pyridyl group, a pyridazinyl group, a thiadiazinyl group, an oxadiazolyl group, a benzoquinolinyl group, a thiadiazolyl group, a pyrrolothiazolyl group, a pyrrolopyridazinyl group, a tetrazolyl group, an oxazolyl group, and a chromanyl group.

These groups may have a substituent represented by R' and R" in Formula (a).

Examples of a substituent represented by "Rb", "Rc", "Rb$_1$" and "Rc$_1$" in Formulas (A) to (C) are: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group, and an allyl group); an alkynyl group (for example, an ethynyl group and a propargyl group); an aryl group (for example, a phenyl group and a naphthyl group); an aromatic heterocyclic group (for example, a furyl group, a thienyl group, a pyridyl group, a pyridazinyl group, a pyrimidinyl group, a pyrazinyl group, a triazinyl group, group, an imidazolyl group, a pyrazolyl group, a thiazolyl group, a quinazolinyl, and a phthalazinyl group); a heterocyclic group (for example, a pyrrolidyl group, an imidazolidyl group, a morpholyl group, and an oxazolidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethyhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethymexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group); a sulfinyl group (for example, a methylsulfinyl group, an ethylsufinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsdfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a halogen atom (for example, a fluorine atom, a chlorine atom and a bromine atom); a fluorinated hydrocarbon group (for example, a fluoromethyl group, trifluoromethyl group, a pentafluoroethyl group and a pentafluorophenyl group); a cyano group; a nitro group; a hydroxyl group; a mercapto group; and a silyl group (for example, a trimethylsilyl group, a triisopropylsilyl group, a triphenylsilyl group, and a phenyldiethylsilyl group).

These groups may be further substituted with the above-described groups.

Examples of an aromatic ring represented by "A1" in Formulas (A) to (C) include: a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring an acenaphthene ring, a coronene ring, a fluorene ring, a fluoroanthrene ring, a naphthacene ring, a pentacene ring, a perylene ring, a pentaphene ring, a picene ring, a pyrene ring, a pyranthrene ring, and an anthraanthrene ring.

Examples of an aromatic heterocyclic ring include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, and a thiazole ring, an indole ring, a benzimidazole ring, a benzothiaxole ring, a benzoxazole ring, a quinoxaline ring, a quinazoline ring, a phthalazine ring, a carbazole ring, a carboline ring, and a diazacarbazole ring (indicating a ring structure in which one of the carbon atoms constituting the carboline ring is replaced with a nitrogen atom).

In Formulas (A) to (C), "M" represents Ir or Pt. In particular, Ir is preferable.

The structures of Formulas (A) to (C) are a partial structure. In order to become a emission dopant having a complete structure, it is required a ligand corresponding to the valence of the center metal. Examples of such ligand are: a halogen (for example, a fluorine atom, a chlorine atom, a bromine atom and an iodine atom), an aryl group (for example, a phenyl group, a p-chlorophenyl group, a mesityl group, a tolyl group, a xylyl group, a biphenyl group, a naphthyl group, an anthryl group, and a phenanthryl group), an alkyl group (for example, a methyl group, an ethyl group, an isopropyl group, a hydroxyethyl group, a methoxymethyl group, a trifluoromethyl group, and a t-butyl group), an alkyloxy group, an aryloxy group, an alkylthio group, an arylthio group, an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, and a phthalazinyl group, and a partial structure obtained by eliminating a metal from Formulas (A) to (C).

As an emission dopant, preferable is a tris body which forms a complete structure with 3 pieces of partial structure of Formulas (A) to (C).

Examples of a blue phosphorescent dopant having a partial structure of Formulas (A) to (C) are listed in the following, however, the present invention is not limited to them.

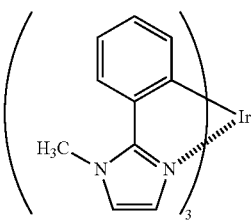

D-1

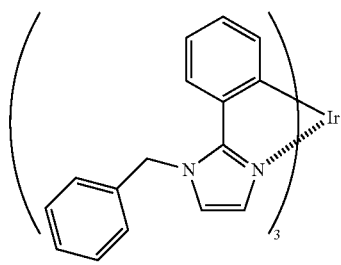

D-2

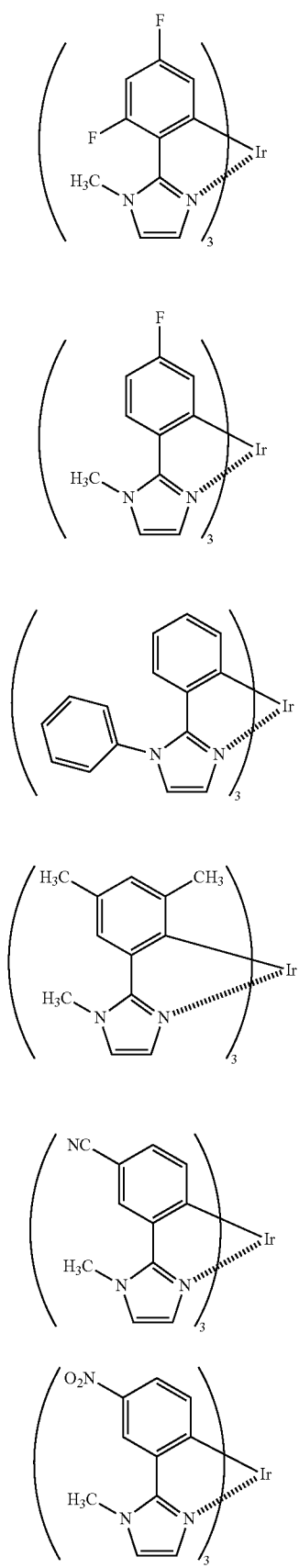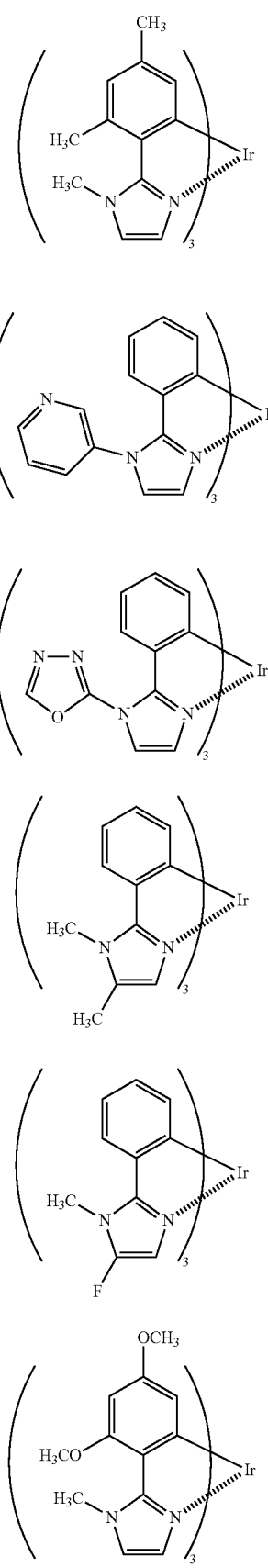

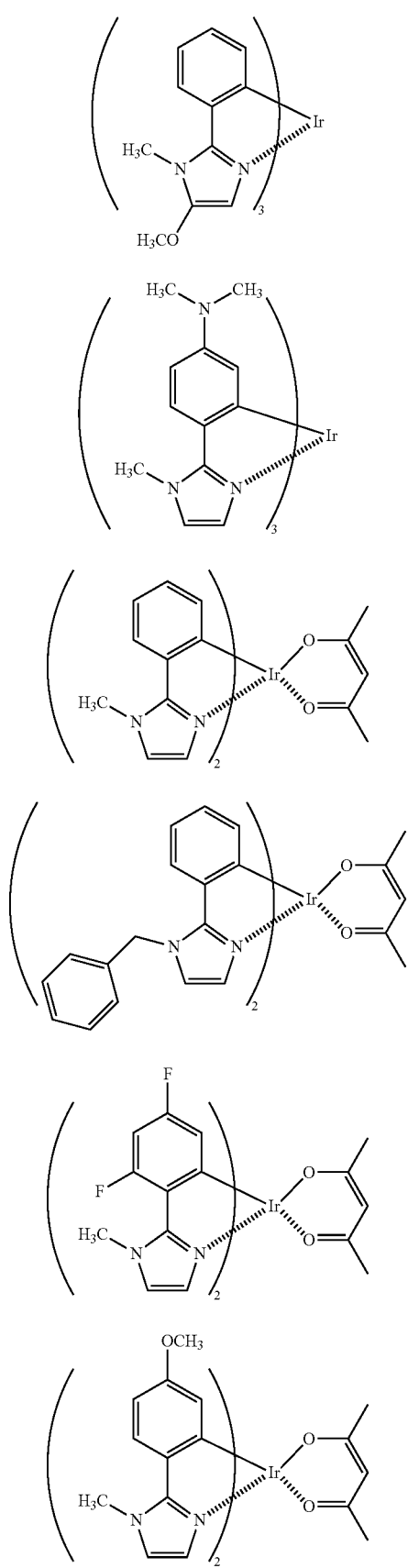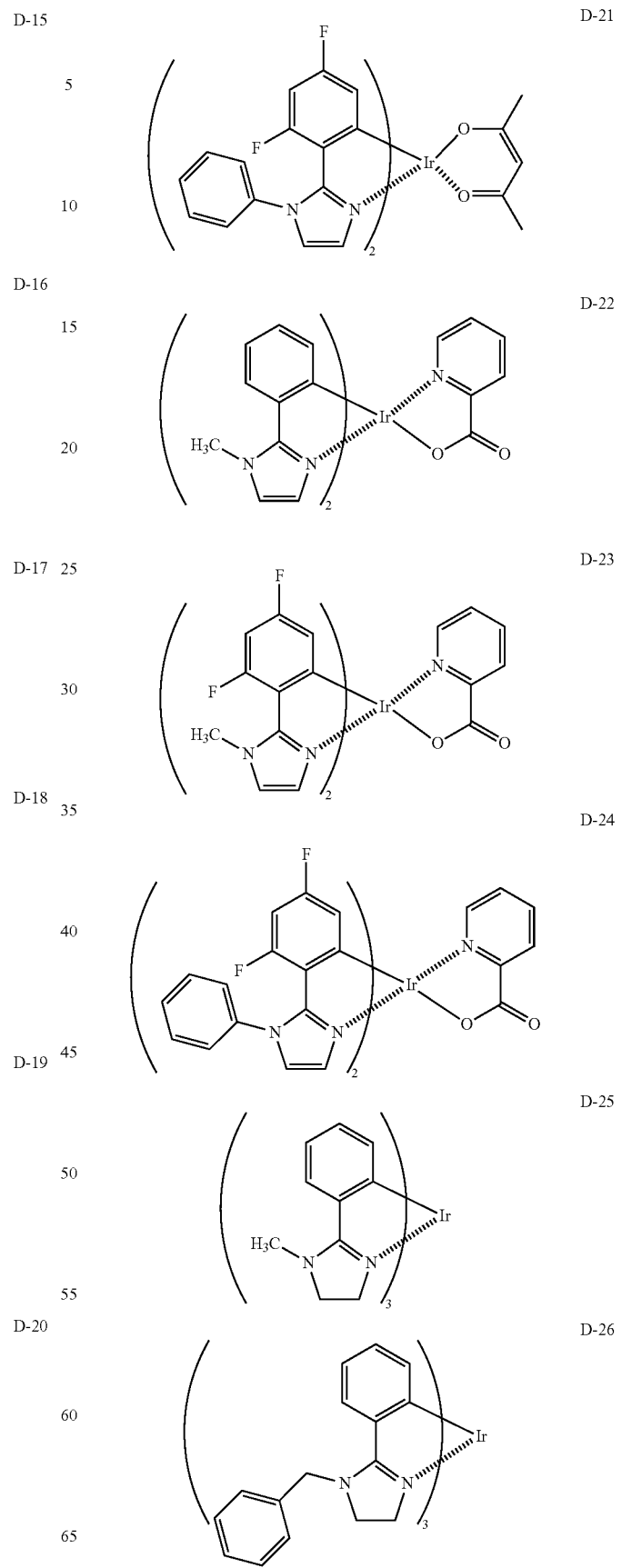

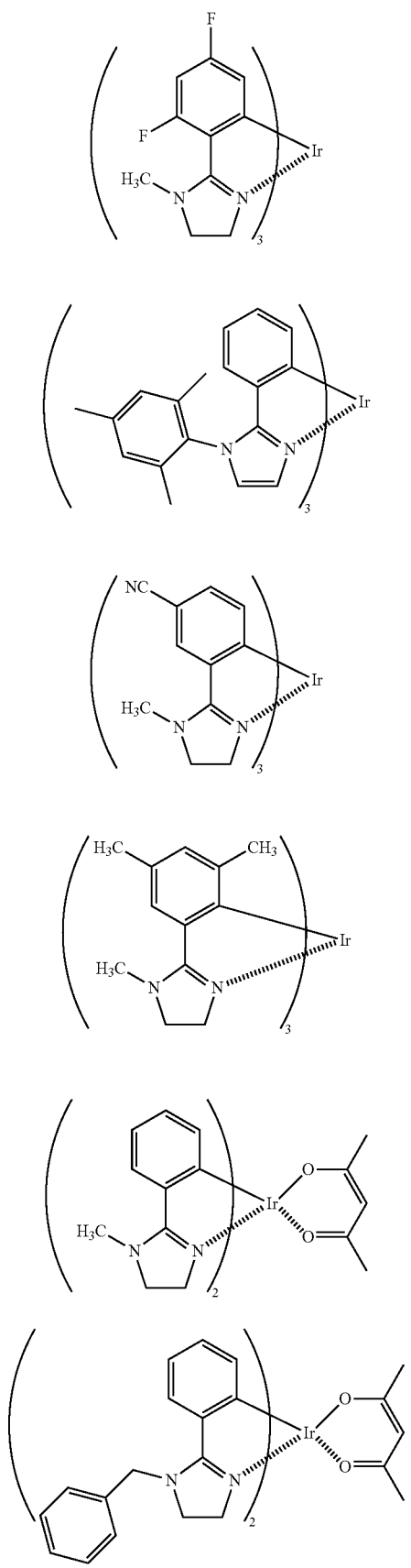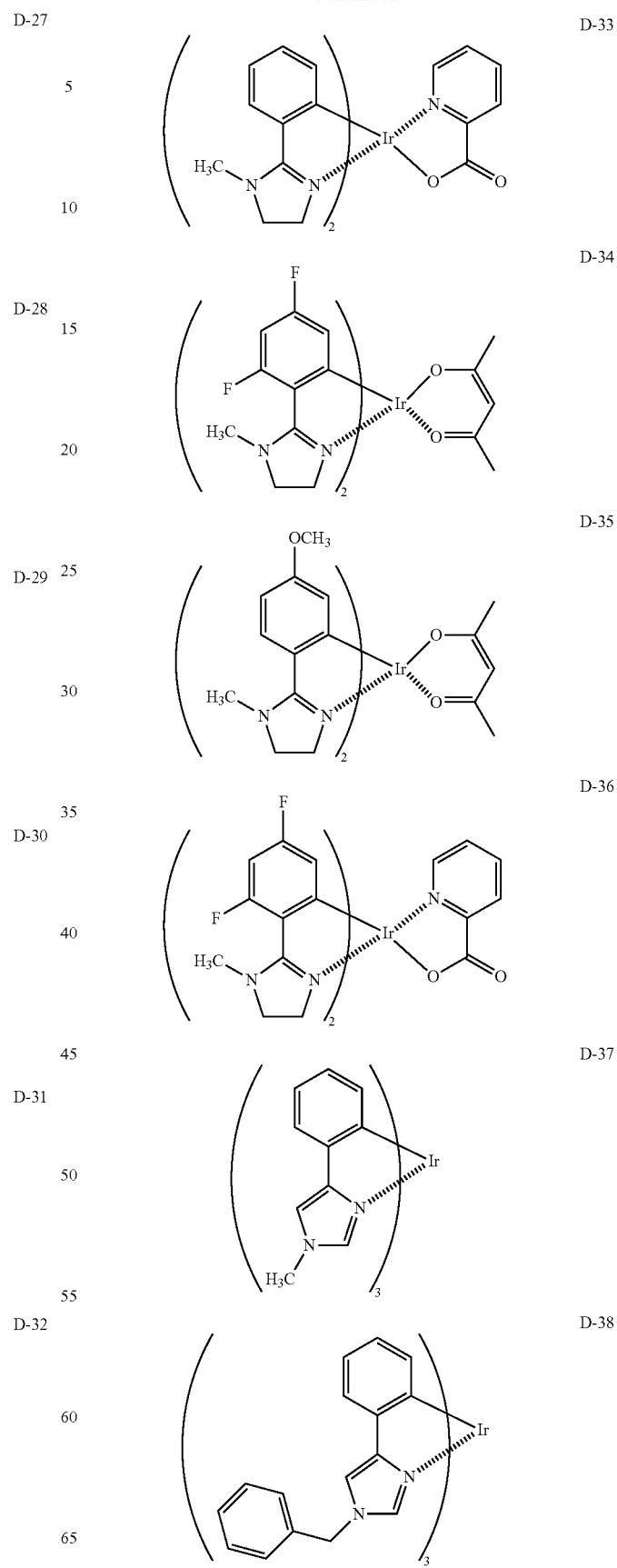

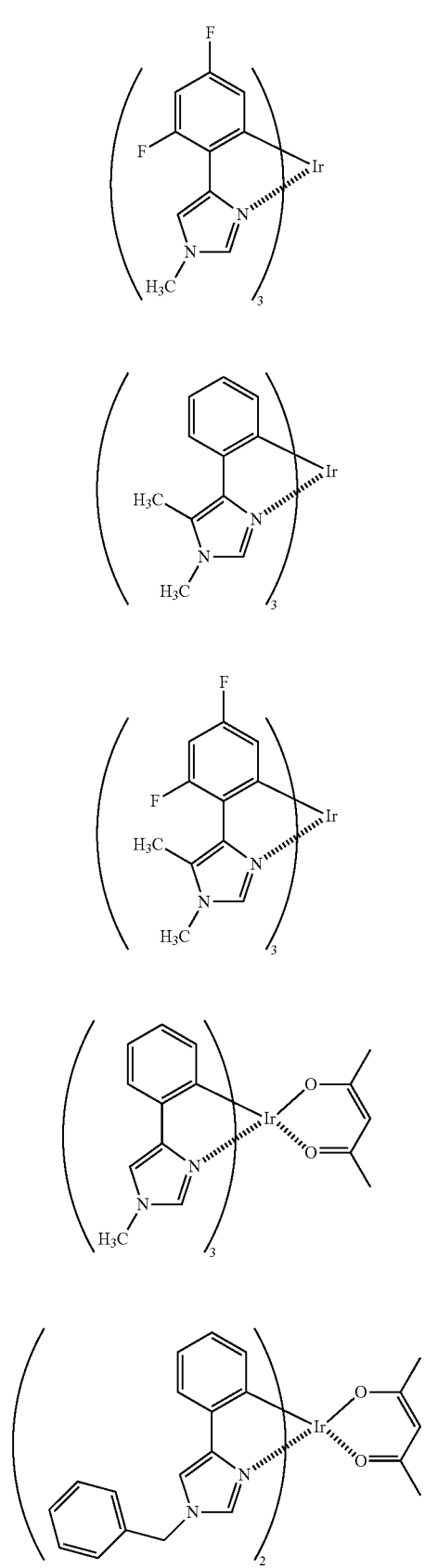

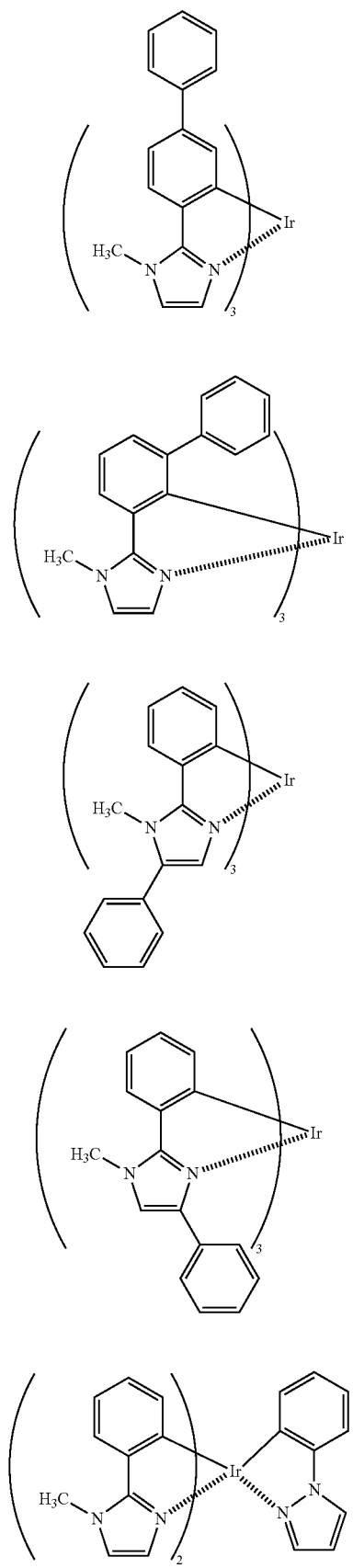
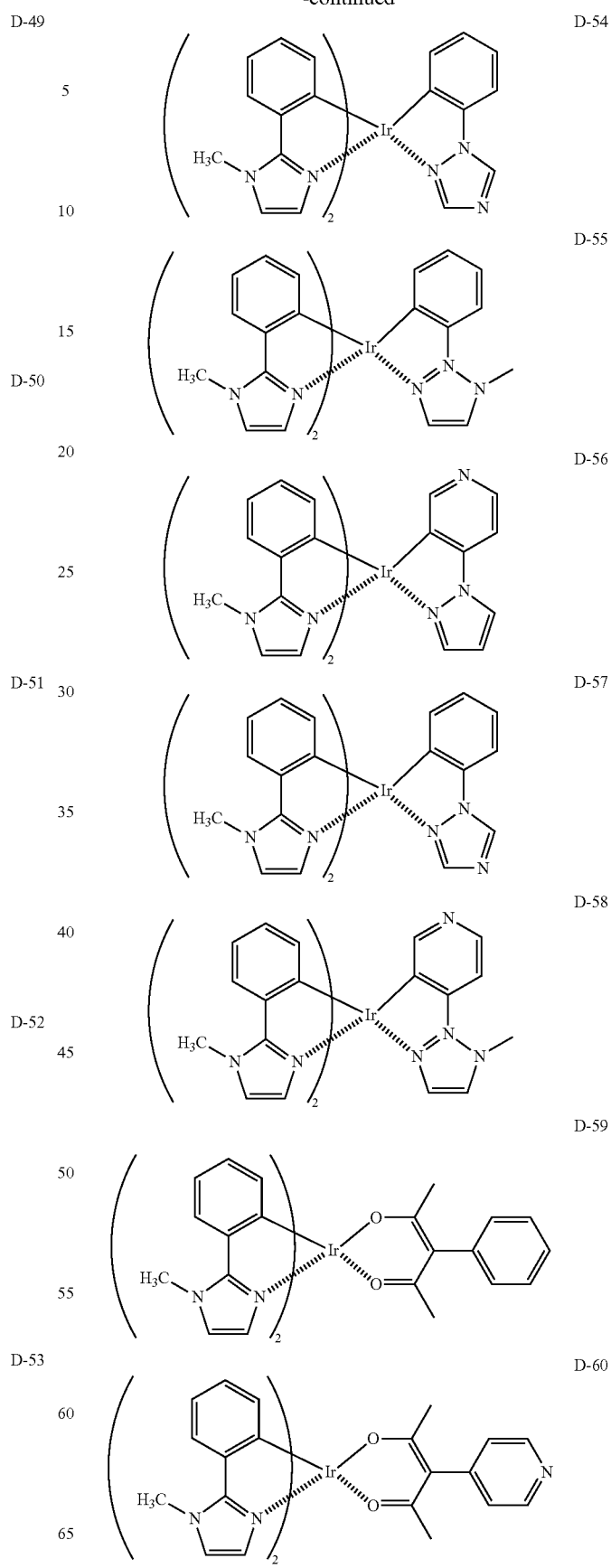

-continued
D-61
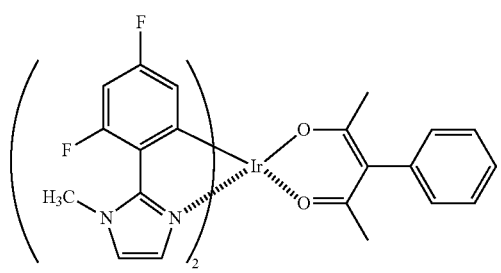
D-62
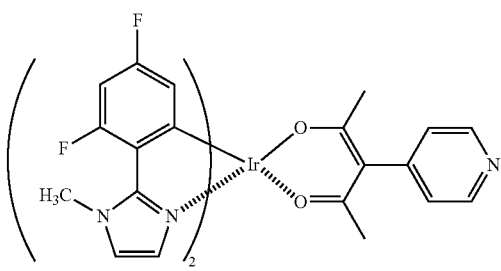
D-63
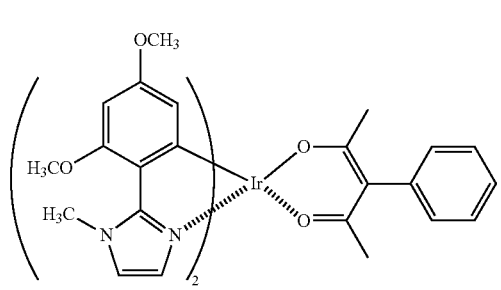
D-64
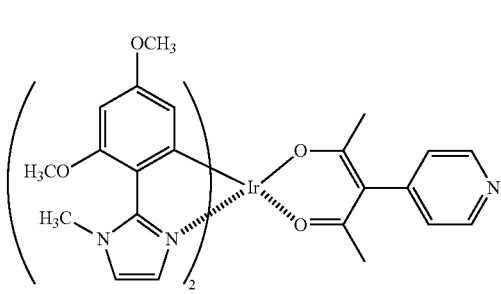
D-65
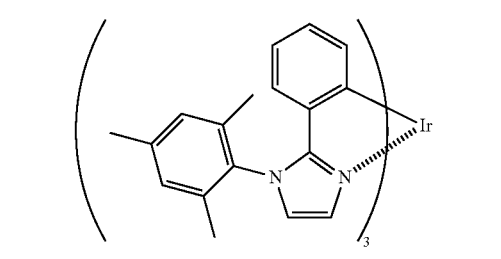
D-66
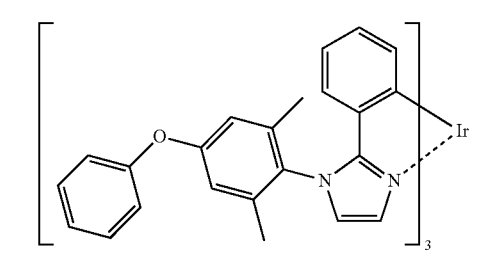
-continued
D-67
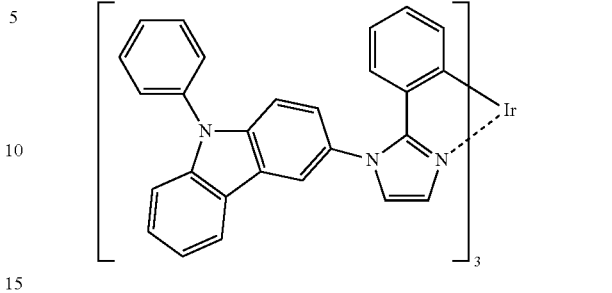
D-68
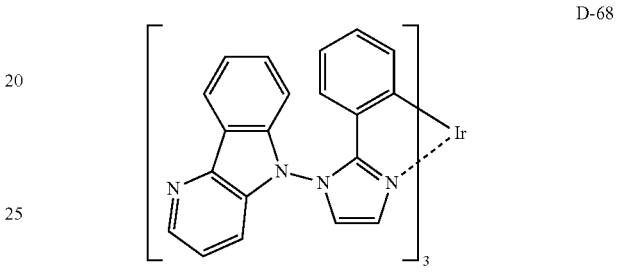
D-69
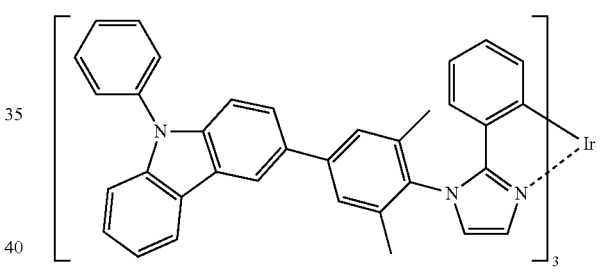
D-70
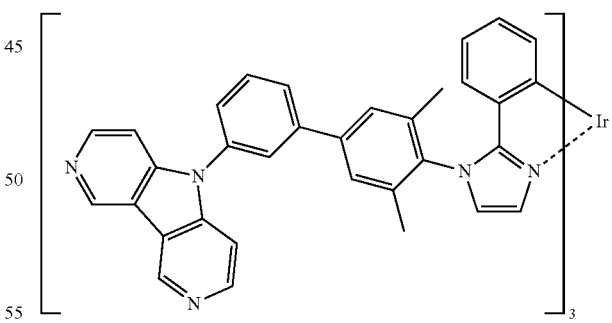
D-71
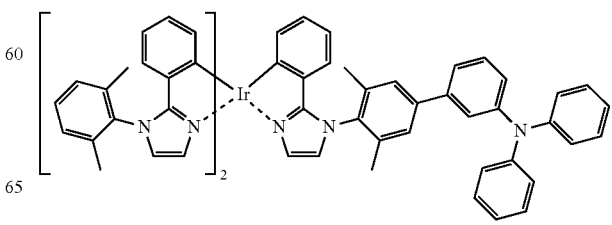

D-72
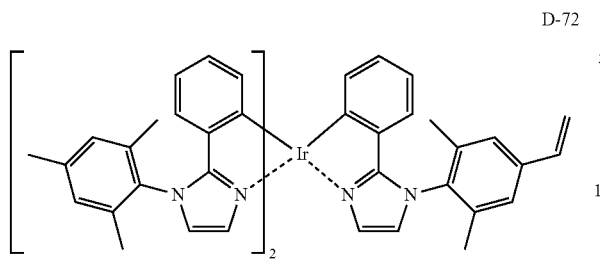
D-73
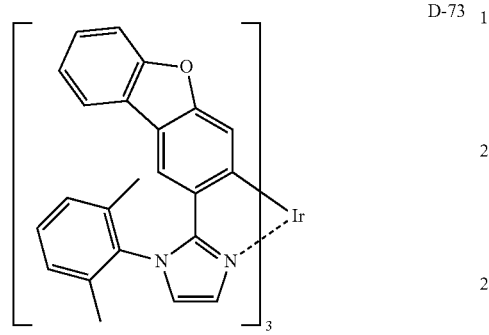
D-74
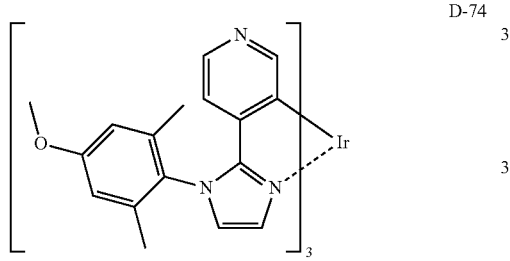
D-75
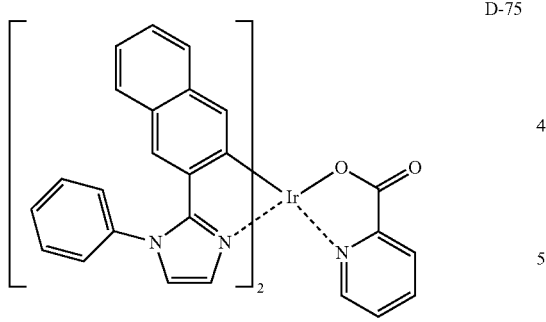
D-76
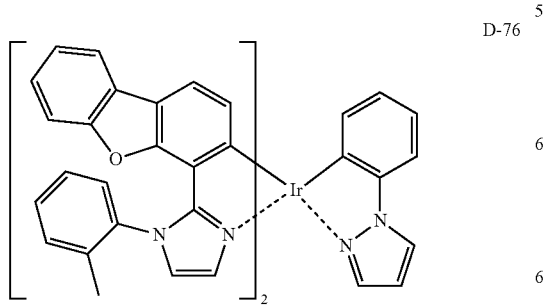
D-77
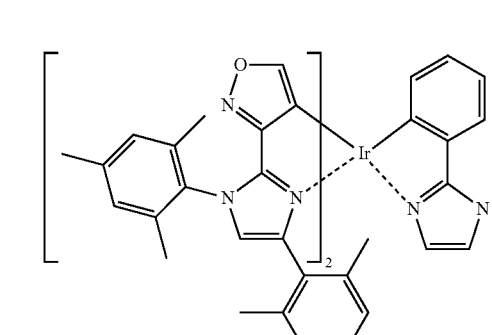
D-78
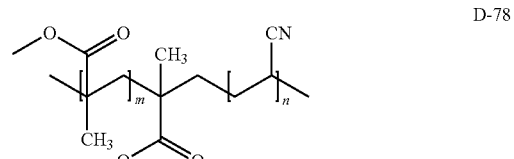
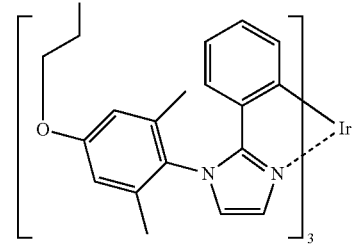
D-79
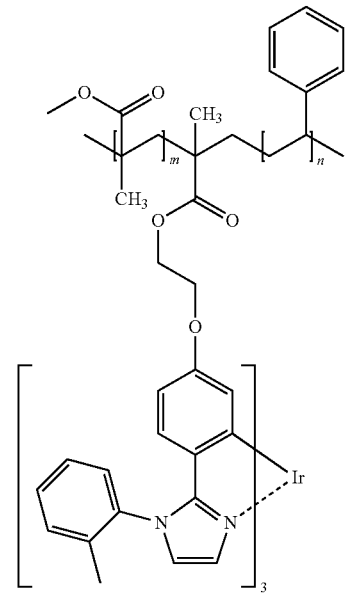

-continued

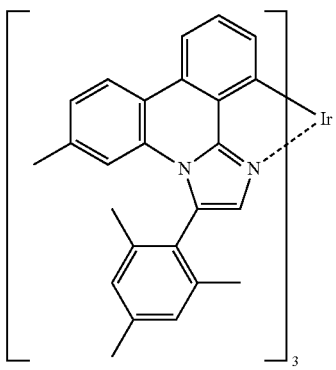
D-80

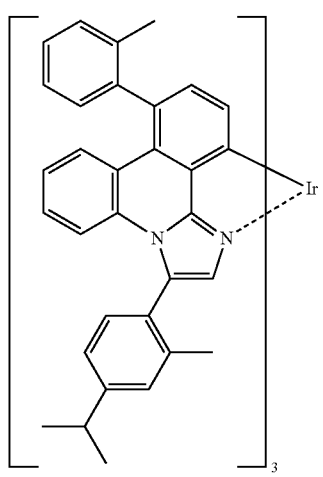
D-81

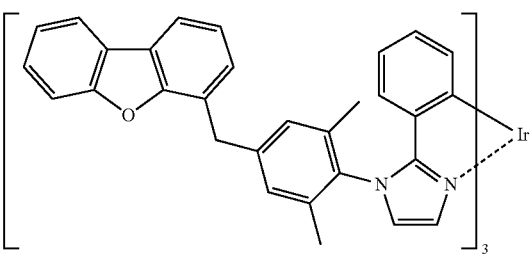
D-82

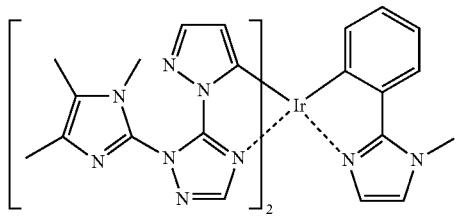
D-83

(3) Fluorescent dopant

Examples of a fluorescent dopant (it may be called as a fluorescence dopant or a fluorescent compound) are: coumarin based dyes, pyran based dyes, cyanine based dyes, croconium based dyes, squarylium based dyes, oxobenzanthracene based dyes, fluorescein based dyes, rhodamine based dyes, pyrylium based dyes, perylene based dyes, stilbene based dyes, polythiophene based dyes, and rare earth complex based fluorescent materials.

<Injection Layer: Hole Injection Layer and Electron Injection Layer>

An injecting layer is provided when needed. The injecting layer may be provided: between an anode or an intermediate metal layer and a light-emitting layer or a hole transport layer, or between a cathode or an intermediate metal layer and a light-emitting layer or an electron transport layer.

An injection layer is a layer which is arranged between an electrode or an intermediate metal layer and an organic layer to decrease a driving voltage and to improve an emission luminance, which is detailed in volume 2, chapter 2 (pp. 123-166) of "Organic EL Elements and Industrialization Front thereof (Nov. 30, 1998, published by N. T. S. Corp.)", and it includes a hole injection layer (an anode buffer layer) and an electron injection layer (a cathode buffer layer).

A hole injection layer (an anode buffer layer) is also detailed in publications such as JP-A Nos. 9-45479, 9-260062 and 8-288069. Specific examples thereof include: a phthalocyanine buffer layer containing such as copper phthalocyanine; an oxide buffer layer containing such as vanadium oxide; an amorphous carbon buffer layer; and a polymer buffer layer employing conductive polymer such as polyaniline (or called as emeraldine) or polythiophene. Further, a material described in JP-A No. 2003-519432 is also preferably used.

A mixture of a plurality of materials may be used for a hole injection layer. In the present invention, however, it is preferable that the hole injection layer is formed by a single organic compound. One of the reasons is the following. When a plurality of materials are used by mixing, it may induce an increased risk of property variation due to the variation of mixing ratio during the production, such as a density variation in the surface of the formed film substrate.

A thickness of a hole injection layer is not specifically limited. Generally, it is in the range of about 0.1 to 100 nm, and preferably, it is in the range of 1 to 30 nm.

As a suitable material for an electron injection layer located between an electron transport layer and a cathode layer, it can cite alkali metals, alkali earth metals having a work function of 3 eV or less, or compounds of these metals. Examples of an alkali metal compound are: potassium fluoride, lithium fluoride, Sodium fluoride, cesium fluoride, lithium oxide, lithium quinoline complex, and cesium carbonate. Lithium fluoride and cesium fluoride are preferable.

In the layer adjacent to the anode side of the intermediate metal layer, it is preferable to avoid a layer composed of an alkali metal compound or an alkali earth metal compound.

A thickness of an electron injection layer is not specifically limited. Generally, it is in the range of about 0.1 to 10 nm, and preferably, it is in the range of 0.1 to 2 nm.

<Blocking Layer: Hole Blocking Layer and Electron Blocking Layer>

A blocking layer is appropriately provided according to necessity. Examples are a hole blocking (hole block) layer described in JP-A Nos. 11-204258, 11-204359 and p. 237 of "Organic EL Elements and Industrialization Front Thereof (Nov. 30, 1998, published by N. T. S. Corp.)".

A hole blocking layer, in a broad meaning, has a function of an electron transport layer. A hole blocking layer is composed of a hole blocking material having a function of transporting an electron but a very small ability of transporting a hole. It can improve the recombination probability of an electron and a hole by blocking a hole while transporting an electron. Further, a constitution of an electron transport layer described later can be appropriately utilized as a hole blocking layer when needed. A hole blocking layer is preferably placed adjacent to a light-emitting layer.

On the other hand, an electron blocking layer, in a broad meaning, has a function of a hole transport layer. An electron blocking layer is composed of a material having a function of transporting a hole but a very small ability of transporting an electron. It can improve the recombination probability of an electron and a hole by blocking an electron while transporting a hole. Further, a constitution of a hole transport layer described later can be appropriately utilized as an electron blocking layer when needed.

A thickness of a hole blocking layer or an electron blocking layer according to the present invention is preferably in the range of 3 to 100 nm, and more preferably, it is in the range of 5 to 30 nm.

<Hole Transport Layer>

A hole transport layer contains a hole transport material having a function of transporting a hole, and in a broad meaning, a hole injection layer and an electron blocking layer are also included in a hole transport layer. A hole transport layer may be provided as a single layer or a plurality of layers.

A hole transport material is a material having any one of a property to inject or transport a hole or a barrier property to an electron, and it may be either an organic substance or an inorganic substance. For example, listed materials are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene none derivative, a hydrazone derivative, a stilbene derivative, a silazane derivative, an aniline type copolymer, or conductive polymer oligomer, and specifically preferably such as thiophene oligomer.

As a hole transport material, those described above can be utilized, however, it is preferable to utilized a porphyrin compound, an aromatic tertiary amine compound and a styrylamine compound, and specifically preferably an aromatic tertiary amine compound.

Representative examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-metylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole. In addition, there are cited those having two condensed aromatic rings in the molecule described in U.S. Pat. No. 5,061,569, such as 4,4'-bis[N-(1-naphthyl)-N-phenylamino]biphenyl(NDP), and 4,4',4"-tris[N-(3-methylphenyl)-N-phenylamino]triphenylamine (MDTDATA), in which three of triphenyl amine units are bonded in a star burst form, as described in JP-A No. 4-308688.

Polymer materials, in which these materials are introduced in a polymer chain or in the main chain of polymer, can be also utilized. Further, an inorganic compound such as a p-type Si and a p-type SiC can be utilized as a hole injection material and a hole transport material.

Further, it is possible to employ so-called p-type hole transport materials, as described in JP-A Nos. 4-297076, 2000-196140, 2001-102175, J. Appl. Phys., 95, 5773 (2004), JP-A No. 11-251067, and J. Huang et al., Applied Physics Letters 80(2002), p. 139, and JP-A No. 2003-519432. In the present invention, since a highly-efficient light emitting element can be prepared, it is preferable to employ these materials.

A hole transport layer may be one layer structure composed of one or a plurality of the above-described materials.

A thickness of a hole transport layer is not specifically limited. Generally, it is in the range of about 5 nm to 5 μm, and preferably, it is in the range of about 5 to 200 nm.

<Electron Transport Layer>

An electron transport layer is composed of a material having a function of transporting an electron. One or a plurality of electron transport layers may be provided.

As an electron transport material used in an electron transport layer, any one of the conventional compounds may be selected and can be employed with the condition that it has a function of transporting an injected electron via a cathode or an intermediate metal layer to a light emitting layer. Examples thereof include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. In addition, a thiadiazole derivative which has a structure of replacing an oxygen atom in the oxadiazole ring with a sulfur atom, and a quinoxaline derivative which has a quinoxaline ring known as an electron inductive group are also used for a material in an electron transport layer. Polymer materials, in which these materials are introduced in a polymer chain or in the main chain of polymer, can be also utilized. In the present invention, when an electron transport layer is placed adjacent to an intermediate metal layer, it is preferable to use a compound having a pyridine ring in the molecular structure.

Further, the following can be used as a material for an electron transport layer: a metal complex of a 8-quinolinol derivative such as tris(8-quinolinol)aluminum ($Alq_3$), tris(5, 7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol) zinc (Znq); and metal complexes in which a central metal of the aforesaid metal complexes is substituted by In, Mg, Cu, Ca, Sn, Ga or Pb. Further, metal-free or metal phthalocyanine, or a compound whose terminal is substituted by an alkyl group or a sulfonic acid group, can be preferably utilized as a material for an electron transport layer. In addition, a distyryl pyrazine derivative used as a material for a light-emitting layer is also used as a material for an electron transport layer. In the same manner as for a hole injection layer and a hole transport layer, an inorganic semiconductor such as an n-type Si and an n-type SiC can be also utilized as a material for an electron transport layer.

A plurality of materials may be used in an electron transport layer. It may carry out doping with an alkali metal, an alkali earth metal, an alkali metal compound or an alkali earth metal compound. However, it is preferable that an electron transport layer is formed with a single organic compound. One of the reasons is the following. When a plurality of materials are used by mixing, it may induce an increased risk of property variation due to the variation of mixing ratio during the production, such as a density variation in the surface of the formed film substrate.

In the present invention, by using an intermediate metal layer having a low work function, it can obtain an appropriate property without deteriorating injection of electrons from the intermediate metal layer without conducting doping with an alkali metal.

A glass transition temperature of an organic compound contained in an electron transport layer is preferably 110° C. or more from the viewpoint of obtaining excellent storage stability at high temperature and process stability at high temperature.

The layer thickness of the electron transport layer is not specifically limited, however, it is generally in the range of about 5 nm to 5 μm, and preferably it is in the range of 5 to 200 nm.

<Support Substrate (2)>

A support substrate used for an organic EL element of the present invention is not specifically limited with respect to types of glass and plastics. The support substrate may be also called as substrate body, substrate, substrate substance, or support. They me be transparent or opaque. However, a transparent support substrate is preferable when the emitted light is taken from the side of the support substrate. Support substrates preferably utilized includes such as glass, quartz and transparent resin film. A specifically preferable support substrate is a resin film capable of providing an organic EL element with a flexible property.

Resin films includes: polyesters such as polyethylene terephthalate (PET) and polyethylene naphthalate (PEN); polyethylene, polypropylene; cellulose esters or their derivatives such as cellophane, cellulose diacetate, cellulose triacetate (TAC), cellulose acetate butylate, cellulose acetate, propionate (CAP), cellulose acetate phthalate, and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyallylate; and cycloolefin resins such as ARTON (produced by JSR Co. Ltd.) and APEL (produce by Mitsui Chemicals, Inc.).

On a surface of a resin film, it may be formed a film incorporating an inorganic or an organic compound or a hybrid film incorporating both compounds. The film is preferably a barrier film having a water vapor permeability of 0.01 g/(m$^2$·24 h) or less determined by the method based on JIS K 7129-1992. More preferably, the film is a high barrier film having an oxygen permeability of $1\times10^{-3}$ ml/(m$^2$·24 h·atm) or less determined by the method based on JIS K 7126-1992, and a water vapor permeability of $1\times10^{-3}$ g/(m$^2$·24 h) or less. Still more preferably, it has an oxygen permeability of $1\times10^{-5}$ ml/(m$^2$·24 h·atm) or less, and a water vapor permeability of $1\times10^{-5}$ g/(m$^2$·24 h) or less.

As barrier film forming materials, the employed materials may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of an inorganic layer and a layer made of an organic material. The laminating order of the inorganic layer and the layer made of an organic material is not particularly limited, but it is preferable that both are alternatively laminated a plurality of times.

Barrier film forming methods are not particularly limited, and examples of employable methods include: a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, as described in JP-A No. 2004-68143.

Examples of opaque support substrates include metal plates such aluminum or stainless steel films, opaque resin substrates, and ceramic substrates.

<Sealing>

As sealing means employed for sealing an organic EL element of the present invention, listed may be, for example, a method in which a sealing member, electrodes, and a supporting substrate are subjected to adhesion with an adhesive. The sealing member may be arranged to cover a display region of an organic EL element, and it may be an engraved plate or a flat plate. Neither transparency nor electrical insulation is limited.

Specifically listed are glass plates, polymer plates, metal plates, and films. Specifically, it is possible to list, as glass plates, soda-lime glass, barium-strontium containing glass, lead glass, aluminosilicate glass, borosilicate glass, barium borosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to make the element to a thin film, a polymer film or a metal film is preferably employed. Further, preferably, the polymer film has an oxygen permeability of $1\times10^{-3}$ ml/(m$^2$·24 h·atm) or less determined, and a water vapor permeability of $1\times10^{-3}$ g/(m$^2$·24 h) or less. More preferably, it has an oxygen permeability of $1\times10^{-5}$ ml/(m$^2$·24 h·atm) or less, and a water vapor permeability of $1\times10^{-5}$ g/(m$^2$·24 h) or less.

Conversion of the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed may be hot-melt type polyamides, polyesters, and polyolefins. Yet further listed may be cationically curable type UV radiation curable type epoxy resin adhesives.

In addition, since an organic EL element is occasionally deteriorated via a thermal process, preferred are those which enable adhesion and curing between room temperature (25° C.) and 80° C. Further, desiccating agents may be dispersed into the aforesaid adhesives. Adhesives may be applied onto sealing portions via a commercial dispenser or printed on the sealing portions in the same manner as screen printing.

When a space is formed between the sealing member and the display region of the organic EL element, it is preferable to inject an inert gas such as nitrogen or argon, or an inert liquid such as a fluorinated hydrocarbon or a silicone oil in the space. It may be made to a vacuum state. Further, a hygroscopic compound may be enclosed in the space.

Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). Among sulfates, metal halides, and perchlorates, suitably employed are anhydrides.

<Protective Film and Protective Plate>

In order to enhance the mechanical strength of the organic EL element, a protective film or a protective plate may be arranged on the outside of the sealing film. Specifically, when sealing is achieved via the sealing film, the resulting mechanical strength is not always high enough, whereby it is preferable to arrange the protective film or the protective plate described above. Usable materials for these include glass plates, polymer plate-films, and metal plate-films which are similar to those employed for the sealing. However, in terms of light weight and decrease in thickness, it is preferable to employ a polymer film.

<Anode (4)>

As electrode substances for an anode, preferable are a metal having a large work function (4 eV or more), an alloy, a conductive compound, and a mixture thereof. Specific examples of such an electrode substance include: a metal such as Au, Ag, and Al; and a conductive transparent material such as CuI, indium tin oxide (ITO), $SnO_2$ and ZnO. Further, a material such as IDIXO ($In_2O_3$—ZnO), which can prepare an amorphous and transparent conductive film, may be also utilized.

As for an anode, these electrode substances may be made into a thin-layer by a method such as evaporation or sputtering, and a pattern of a desired form may be formed by means of photolithography. When requirement of pattern precision is not so severe (about precision of 100 μm or more), a pattern may be formed through a mask of a desired form at the time of evaporation, or sputtering of the above-described substance. Alternatively, when coatable materials such as organic conductive compounds are employed, it is possible to employ a wet system film forming method such as a printing system or a coating system.

When emitted light is taken out of this anode side, the transmittance is preferably set to be 10% or more. The sheet resistance as an anode is preferably a several hundred Ω/square or less. Further, although the layer thickness depends on a material, it is generally selected from the range of 5 to 1,000 nm, and preferably from the range of 5 to 200 nm.

<Cathode (12)>

On the other hand, as a cathode, there are used a metal, an alloy, a conductive compound, and a mixture thereof. Specific examples of such an electrode substance include: sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, a rare earth metal, silver, and aluminum. Among them, with respect to durability against electron injection and as oxidation, preferable are: a mixture of an electron injecting metal with a second metal which is stable metal having a work function larger than the electron injecting metal. Examples thereof are: a magnesium/silver mixture, a magnesium/aluminum mixture, a magnesium/indium mixture, an aluminum/aluminum oxide ($Al_2O_3$) mixture, a lithium/aluminum mixture, aluminum and silver.

As for a cathode, these electrode substances may be made into a thin layer by a method such as vapor deposition or sputtering.

Further, the sheet resistance as a cathode is preferably a several hundred Ω/square or less. The layer thickness is generally selected from the range of 5 nm to 5 μm, and preferably, from the range of 5 to 200 nm.

Herein, to transmit produced emission, either one of an anode or a cathode of an organic EL element is preferably transparent or translucent to improve the emission luminance.

Further, after forming, on the cathode, the above material in a film having a thickness of 1 to 20 nm, it is possible to prepare a transparent or translucent cathode in such a manner that electrically conductive transparent materials described for the anode are prepared thereon. By applying the above, it is possible to produce an element in which both anode and cathode are transparent.

<<Production Method of Organic EL Element Having a Light-Emitting Pattern>>

A production method of an organic EL element having a light-emitting pattern of the present invention is characterized in that an organic EL element provided with one or a plurality of organic functional layers between a pair of electrodes can change two or more kinds of light-emitting patterns depending on the situations.

Here, "a pattern" indicates a design (a pattern or a design of drawing), a character, or an image displayed by an organic EL element.

In the following, a production method of an organic EL element 1 illustrated in FIG. 1 will be described as an example.

(1) Laminating Step

In a production method of an organic EL element 1 of the present invention, it is carried out a step of laminating (laminating step) layers on a support substrate 2 to form: an anode 4, a light emitting unit 6, an intermediate metal layer 8, a light emitting unit 10, and a cathode 12.

First, a support substrate 2 is prepared. On the support substrate 2, there is formed a thin film of a required electrode substance, for example, a thin film made of a anode substance with a thickness of 1 μm or less, preferably, in the range of 10 to 200 nm via a method such as a vapor deposition method or a sputtering method to result in forming an anode 4. At the same time, a taking-out electrode 4a is formed at the edge portion of the anode 4 to connect with an outer electric source by using an appropriate method such as a vapor deposition method.

Next, on this, there are sequentially laminated a hole injection layer, a hole transport layer, a light emitting layer and an electron transport layer, which form a light emitting unit 6. Here, during the time of forming the light emitting unit 6, a shadow mask pattern of film forming is suitably selected so that a different pattern is formed from the pattern of the light emitting unit 10 described later. The shadow mask pattern may be used for all of the layers of a hole injection layer, a hole transport layer, a light emitting layer, an electron transport layer and an electron injection layer. However, from the viewpoint of film forming accuracy, it is preferably used for a hole injection layer and a hole transport layer. More preferably, the shadow mask is used only for a hole injection layer.

The formation of each of these layers may be done with a spin coating method, a cast coating method, an inkjet method, a vapor deposition method, and a printing method. From the viewpoint of obtaining a uniform layer and hardly producing a pinhole, particularly preferable methods are a vacuum vapor deposition method and a spin coating method. Further, a different layer forming method may be used layer by layer. When a vapor deposition method is adopted for forming each of these layers, the conditions of vapor deposition are different depending on the kinds of compounds used. Generally, it is preferable to suitably select the following conditions, heating temperature of a boat: 50 to 450° C.; vacuum level: $1\times10^{-6}$ to $1\times10^{-2}$ Pa; vapor deposition rate: 0.01 to 50 nm/sec; temperature of a substrate: −50 to 300° C.; and layer thickness: 0.1 to 5 μm.

After forming these layers, there is formed thereon a thin film made of an intermediate metal layer material with a thickness in the range of 0.6 to 5 nm, more preferably in the range of 0.8 to 3 nm, still more preferably in the range of 0.8 to 2 nm via a vapor deposition method to result in providing an intermediate metal layer 8.

Subsequently, in the same manner as formation of the light emitting unit 6, each layer of the light emitting unit 10 is formed. At this moment, as described above, a different shadow mask pattern from that of the light emitting unit 6 is used during the film formation.

After forming the light emitting unit 10 as described above, a cathode 12 is formed thereon via a suitable method such as a vapor deposition method or a sputtering method. In this case, the cathode 12 is formed in a pattern having a shape of pulling out an edge portion from the upper portion of the light emitting unit 10 to the periphery of the support substrate 2, while maintaining an insulating state with respect to the intermediate metal layer 8 and the anode 4 by the light emitting units 6 and 10.

(2) Sealing Step

After the laminating step, a step of sealing the organic EL element 1 (sealing step) is carried out.

That is, the sealing material is placed on the support substrate 2 to cover at least the light emitting units 6 and 10, while keeping the edge portions of the anode 4 (taking-out electrode 4a) and the edge portion of the cathode 12 in the exposed condition.

(3) Light Irradiation Step

An organic EL element 1 having a light-emitting pattern can be produced by modulating a light emitting function of the light emitting units 6 and 10 by light irradiation.

Here, "to modulate a light emitting function by light irradiation" indicates the process by which the function of the hole transport layer composing the light emitting unit is changed by light irradiation so that the light emitting function of the light emitting unit is modified.

In the light irradiation step, the method of the light irradiation may be any method and it is not specifically limited as long as it can make a light emitting portion which is changed the luminance at a predetermined pattern region of the light emitting units 6 and 10 by a predetermined light irradiation.

Light irradiated in the light irradiation step may contain UV rays, visible rays or infrared rays. Preferably, it contains UV rays.

In the present invention, a UV ray is an electromagnetic wave having a longer wavelength than an X ray and a shorter wavelength than a shortest wavelength of a visible light. Specifically, it is an electromagnetic having a wavelength of 1 to 400 nm.

A generating means and irradiation means of UV rays is not specifically limited as long as they generate UV rays and irradiate with conventionally known apparatus. Examples of a specific light source are: a high pressure mercury lamp, a low pressure mercury lamp, a hydrogen (deuterium) lamp, a rare gas (e.g., xenon, argon, helium, neon) discharge lamp, a nitrogen laser, an excimer laser (e.g., XeCl, XeF, KrF, KrCl), a hydrogen laser, a halogen laser, and a harmonic wave light of various visible (LD) to infrared laser (e.g., THG (Third Harmonic Generation) of YAG laser).

This light irradiation step is preferably done after the sealing step.

In the light irradiation step, it is possible to change the light-emitting luminance of the irradiated portion according to the amount of light irradiation by changing an amount of light irradiation by adjusting the strength of the light or the irradiation time. The light-emitting luminance will be more decreased when the amount of light irradiation is larger. The light-emitting luminance will be less decreased when the amount of light irradiation is smaller. Consequently, the light-emitting luminance is maximum when the amount of light irradiation is 0, that is, when it is not irradiated.

By the steps described above, an organic EL element 1 having a required light-emitting pattern can be produced. In the production of this organic EL element, it is preferable that the production from the light emitting unit 6 to the cathode 12 is done with one time vacuuming operation. However, it may employ a different production method by taking out the support substrate 2 from the vacuum atmosphere on the way. In that case, it is required to conduct the operations under a dry inert gas atmosphere.

When a direct-current voltage is applied to the produced organic EL element 1, light emission can be observed by applying voltage of 2 o 40 V to the electrodes arranged at the both side of the light emitting units 6 or 10 (for example, the anode 4 is made to have plus (+) polarity, and the intermediate metal layer 8 is made to have minus (−) polarity). Further, an alternating-current voltage may be applied. In addition, an arbitrary wave shape may be used for applying alternating-current.

In this case, an electric current flows only to the light-emitting pattern portion. Therefore, electric power consumption can be decreased compared with LED which guides light to an unrequired portion.

Further, higher form accuracy can be achieved by carrying out patterning with light irradiation in addition to patterning with a mask.

<Light-Emitting Pattern of Organic EL Element>

When the light-emitting luminance is changed to decrease by light irradiating an organic EL element having a light-emitting pattern, if light irradiation is done at one time to the organic EL element having been finished the sealing step, each light emitting unit cannot display a different design or mark.

In order to avoid this, when it is intended to change the design or mark between the light emitting units, it is preferable that the organic layers (in particular, a hole transport layer or a hole injection layer) are subjected to mask patterning with a film forming mask, and then, the light-emitting luminance change process by light irradiation is performed at the final trimming arrangement.

In the following, an organic EL element 1 illustrated in FIG. 1 will be described in more detail by referring to the drawings.

Figure 2A:
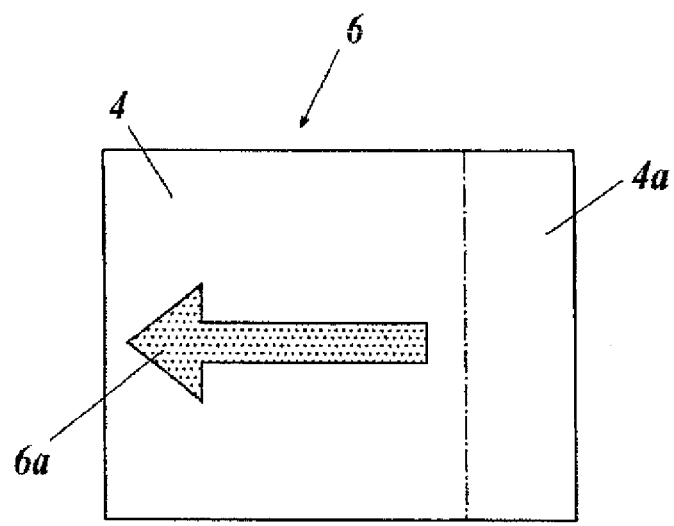
FIG. 2A is a plan view illustrating a pattern shape in a hole injection layer of a light emitting unit.

First, at the moment of film formation of a hole injection layer 6a of the light-emitting unit 6, a vapor deposition step is performed using a metal mask having an aperture form corresponding to FIG. 2A. The hole injection layer 6a illustrated by FIG. 2A is formed.

Subsequently, at the moment of film formation of a hole injection layer 10a of the light-emitting unit 10, a vapor deposition step is performed similarly using a metal mask having an aperture form corresponding to FIG. 2B. The hole injection layer 10a illustrated by FIG. 2B is formed.

By the above-described method, it becomes possible to confirm light emission of arrow shapes corresponding to FIGS. 2A and B in each light-emitting unit 6 or 10. However, the form accuracy of the arrow shape contains blurring due to film forming widening at the vapor evaporation step. As a result, the surrounding of the arrow shape will have a certain amount of luminance, and it becomes a vague shape.

Figure 3:
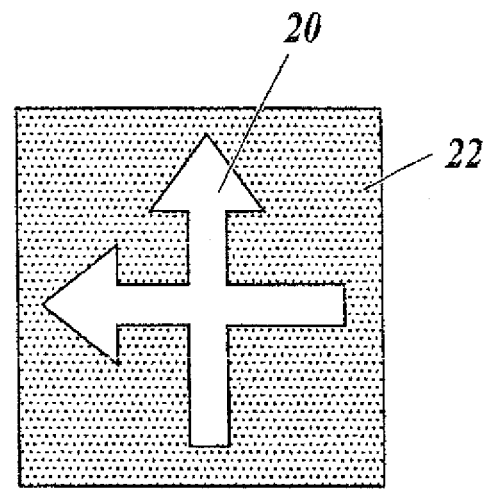
FIG. 3 is a plan view illustrating an irradiating region with UV rays and a non-irradiating region.

In order to solve this problem, the light irradiation step is carried out after performing the film formation step and the sealing step. Specifically, in order to obtain a light emitting image illustrated in FIG. 3, there is prepared a mask plate which is processed to be non-light transparent so that a non-irradiated region 20 is shielded from light. Then, the light emitting positions of FIGS. 2A and B and the above-described mask plate are positionally adjusted and the mask plate is fixed. After termination of the position adjustment, the light irradiation step is performed to change the luminance of the surrounding of the arrow shape (an irradiated region 22). By this method, it is possible to form a design or a mark with high form accuracy even when the light emitting units are plural and the light-emitting shape is changed in each light emitting unit.

Figure 2B:
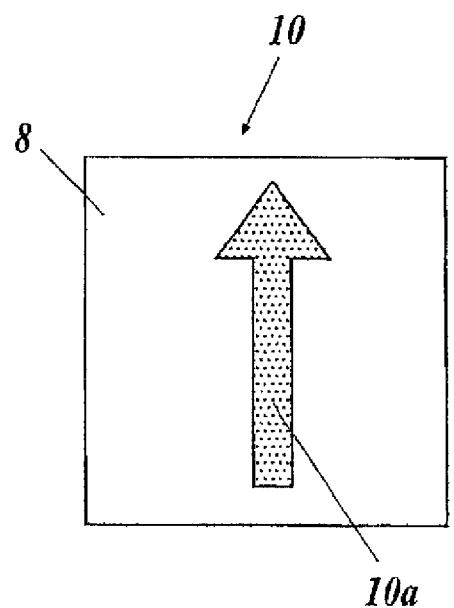
FIG. 2B is a plan view illustrating a pattern shape in a hole injection layer of a light emitting unit.

The organic EL element 1 produced as described above displays a light-emitting pattern having the shape illustrated in FIG. 2A when only the light emitting unit 6 is driven, and it displays a light-emitting pattern having the shape illustrated in FIG. 2B when only the light emitting unit 10 is driven.

An electric drive of the light emitting units 6 and 10 is controlled by a driver IC (Integrated circuit) based on information of a position sensor.

Figure 4A:
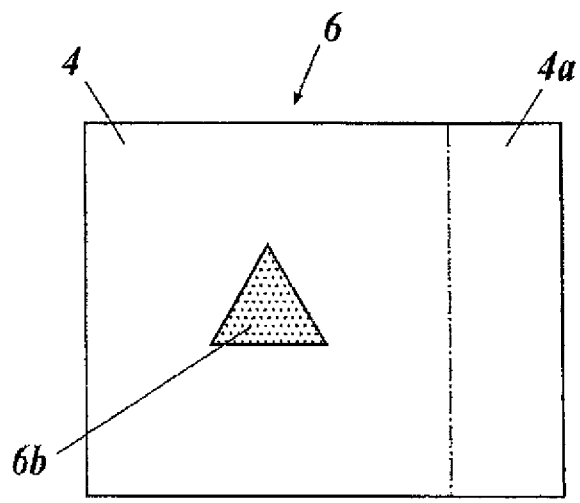
FIG. 4A is a plan view illustrating a pattern shape in a hole injection layer of a light emitting unit.
Figure 4B:
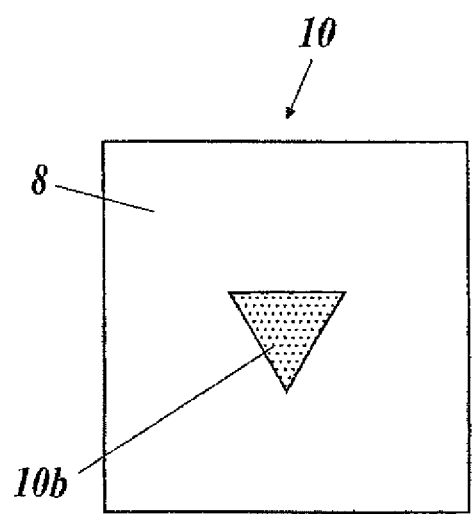
FIG. 4B is a plan view illustrating a pattern shape in a hole injection layer of a light emitting unit.

In addition, as another embodiment, light-emitting patterns illustrated in FIGS. 4A and B can be formed. As illustrated in FIG. 4A, a hole injection layer 6b of the light-emitting unit 6 is formed to be a triangle shape. As illustrated in FIG. 4B, a hole injection layer 10b of the light-emitting unit 10 is formed to be a triangle shape which is rotated the shape of the hole injection layer 6b of the light-emitting unit 6 by 180 degree (an inversed triangle shape).

Figure 5:
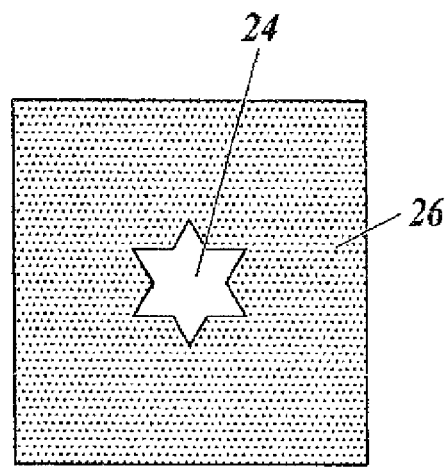
FIG. 5 is a plan view illustrating an irradiating region with UV rays and a non-irradiating region.

In this case, similar to the above-described situation and as illustrated in FIG. 5, UV rays are irradiated to change the luminance of the irradiated region 26. The region which forms the hole injection layers 6b and 10b of the light-emitting units 6 and 10 is designated as a non-irradiated region 24, and the other portion is designated as an irradiated region 26.

In this embodiment, a light-emitting pattern having the shape illustrated in FIG. 4A is observed when only the light emitting unit 6 is driven, and a light-emitting pattern having the shape illustrated in FIG. 4B is observed when only the light emitting unit 10 is driven. Further, a hexagram shape can be obtained when the light emitting units 6 and 10 are driven at the same time.

The emission color of the light emitting units 6 and 10 may be any color. The color may be the same or different.

<<Application of Organic EL Element>>

An organic EL element of the present invention is suitably applied to a various kinds of devices. In the following, an organic EL module is described as an example.

<<Constitution of Organic EL Module>>

In the present invention, the organic EL module is designated as a mounted body having a structure in which a conductive material (member) is bonded to an anode and a cathode of at least one organic EL element, and further, it is connected to an interconnection substrate. The organic EL module has an independent function of itself.

Figure 6:
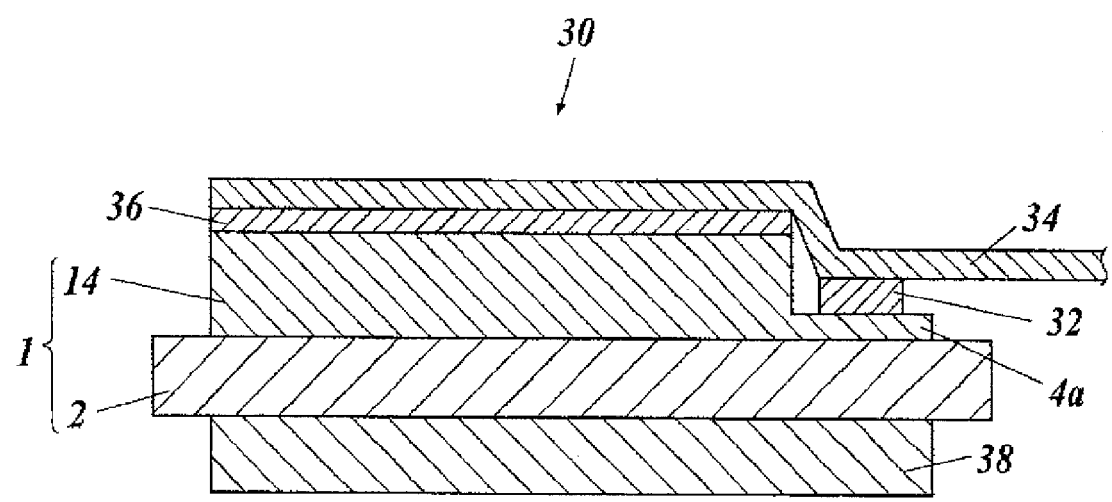
FIG. 6 is a schematic cross sectional view illustrating an example of an organic EL element module.

An example of an organic EL module of the present invention is illustrated in FIG. 6.

As illustrated in FIG. 6, an organic EL module 30 is mainly composed of an organic EL element 1 (a laminated body 14), an anisotropic conductive film (ACF) 32, and a flexible printed circuit 34.

The organic EL element 1 is provided with a laminated body 14 which contains a support substrate 2, electrodes, and a various kinds of organic functional layers. The anode 4 (refer to FIG. 1) is pulled out on an edge portion of the support substrate 2 on which the laminated body 14 is not formed. This taking-out electrode 4a and the flexible printed circuit 34 are electrically connected through the anisotropic conductive film 32.

The flexible printed circuit 34 is bonded onto the organic EL element 1 (the laminated body 14) through an adhesive 36. The flexible printed circuit 34 is bonded to a driver IC and a print substrate not illustrated here.

Although not illustrated in FIG. 6, a taking-out electrode is also formed from the cathode 12 (refer to FIG. 1). This taking-out electrode and the flexible printed circuit 34 are electrically connected.

Further, in the present invention, a polarizing member 38 may be disposed on the light emitting surface side of the support substrate 2. A half mirror or a black filter may be used in place of the polarizing member 38. By this, the organic EL module 30 of the present invention can display black which cannot be done with light guide dots of LED.

<Anisotropic Conductive Film (32)>

An anisotropic conductive film according to the present invention is made of conductive particles such as metal cores of gold, nickel, and silver, or resin cores plated with gold dispersed in a binder.

A thermoplastic resin or a thermo-setting resin is used as a binder. Among them, a thermo-setting resin is preferable, and an epoxy resin is more preferable.

An anisotropic conductive film having nickel fibers as a filler can be suitably used.

In the present invention, a fluid material such as a conductive paste, for example, a silver paste, may be used in place of the anisotropic conductive film.

<Polarizing Member (38)>

As a polarizing member according to the present invention, a commercially available polarizing plate or a circularly polarizing plate are cited.

A polarizing film, which is a principal constitution member of a polarizing plate, is an element passing only light having a polarization plane with a predetermined direction. A representative element is a polyvinyl alcohol polarizing film. There are mainly two: one is a polyvinyl alcohol film dyed with iodine, and another is a polyvinyl alcohol film dyed with a dichroic dye. A polarizing film is produced by film formation of a polyvinyl alcohol aqueous solution, then, the produced film is stretched to one direction, followed by dying. Otherwise, it is produced by dying the film at first, then carrying out one directional stretching. Preferably, the film is further subjected to a durability treatment with a boron compound is used. A thickness of a polarizing film is in the range of 5 to 30 μm, preferably in the range of 8 to 15 μm. In the present invention, these films are suitably used.

Further, a commercially available polarizing plate protective film is preferably used. Specific examples thereof are: KC8UX2MW, KC4UX, KC5UX, KC4UY, KC8UY, KC12UR, KC4UEW, KC8UCR-3, KC8UCR-4, KC8UCR-5, KC4FR-1, KC4FR-2, KC8UE, and KC4UE (made by Konica Minolta, Inc.).

An adhesive used for bonding a polarizing member and a support substrate is preferably a substance of optically transparent and also exhibiting appropriate elasticity and adhesiveness.

Specific examples are: an acrylic copolymer, an epoxy resin, polyurethane, a silicone polymer, polyether, a butyral resin, a polyamide resin, a polyvinyl alcohol resin and a synthetic rubber. Among them, an acrylic copolymer is preferably used since its adhesion property can be controlled most easily and it is excellent in transparency, weather-resistant, and durability.

These adhesives are applied on a substrate and they can be formed in a film by curing with a method such as: a drying method, a chemical curing method, thermo-setting method, a thermo-melting method, and a photo-curing method.

<<Production Method of Organic EL Module Having a Light-Emitting Pattern>>

An organic EL module can be produced by connecting the taking-out electrode from the anode which is an electric current supplying portion with the taking-out electrode (not illustrated in the drawing) from the cathode which is an electric current receiving portion.

In particular, when an anisotropic conductive film is used as a connecting way, the anisotropic conductive film and the taking-out electrode are electrically connected by a temporary bonding step of the anisotropic conductive film with a temporary pasting temperature, and by a pressure bonding step in which conductive particles having a function of electric connection contained in the anisotropic conductive film are pressed.

When the support substrate is a film substrate, it is selected an anisotropic conductive film having a pressure bonding temperature of in the range of 100 to 150° C. in order to reduce thermal damage to the film substrate (for example, MF series made of Hitachi Chemical, Co. Ltd.).

More specifically, first, a temporary bonding step of the anisotropic conductive film is conducted. In this step, an ACF pasting apparatus (LD-30, made by Ohashi Engineering, Co.) is used, for example. A heat tool temperature for the temporary pasting is set to be about 80° C. After conducting position adjustment of the organic EL element with the anisotropic conductive film, the pasting is done with a predetermined pressure (0.1 to 0.3 MPa) for about 5 seconds.

Subsequently, a full bonding step (a pressure bonding step) is conducted. In this step, a full pressure bonding apparatus (BD-02, made by Ohashi Engineering, Co.) is used, for example. A heat tool temperature for the full pressure bonding is set to be about 130 to 150° C. Then, a contact pad of a flexible printed circuit connecting to an organic EL element is set by positional adjusting to the taking-out electrode of the organic EL element. After termination of position adjustment, pressure bonding is carried out on the flexible printed circuit with a predetermined pressure (1 to 3 MPa) for about 10 seconds. Thus, the full pressure bonding step is completed. After bonding, a silicone resin may be potted on the bonded portion to fortify the bonded portion of the anisotropic conductive film.

Further, according to the application, it may be provided with a polarizing member, a half mirror member, or a black filter on a light emitting surface side of the support substrate.

EXAMPLES

The present invention will now be described with reference to examples, however, the present invention is not limited thereto. In addition, an indication of "%" is used in examples. This represents "volume %", if it is not particularly mentioned.

<<Preparation of Organic EL Element>>

An anode was prepared by making patterning to a glass substrate of 30 mm×60 mm, thickness of 0.7 mm and having been formed with a film of ITO (indium tin oxide) with a thickness of 150 nm. Thereafter, this transparent support substrate provided with the ITO transparent electrode was subjected to ultrasonic washing with isopropyl alcohol, followed by drying with desiccated nitrogen gas, and was subjected to UV ozone washing for 5 minutes. The resulting transparent support substrate was fixed to a substrate holder of a commercial vacuum deposition apparatus.

In each heating boat for vapor deposition in the vacuum deposition apparatus was loaded with an appropriate amount of constituting material for each layer. The heating boat for vapor deposition was prepared with a resistance heating material of molybdenum or tungsten.

After reducing the pressure of a vacuum tank to $1 \times 10^{-4}$ Pa, by using a shadow mask which can make pattering of the design of FIG. 2A, a deposition heating boat containing a compound M-4 was heated via application of electric current and vapor deposition was made onto the transparent support substrate at a deposition rate of 0.1 nm/sec, whereby it was produced a layer having a thickness of 15 nm.

Subsequently, a compound M-2 was vapor deposited in a similar way, and it was produced a layer having a thickness of 40 nm.

Subsequently, a compound BD-1, a compound GD-1, a compound RD-1, a compound H-1, and a compound H-2 were co-deposited at a deposition rate of 0.1 nm/sec so that the contents of the following compounds were made as follows: the compound BD-1: 5%, the compound GD-1: 17%, and the compound RD-1: 0.8%. Thus, it was formed a first white light emitting layer having a thickness of 30 nm.

Subsequently, a compound E-1 was vapor deposited at a deposition rate of 0.1 nm/sec, and it was produced a layer having a thickness of 30 nm.

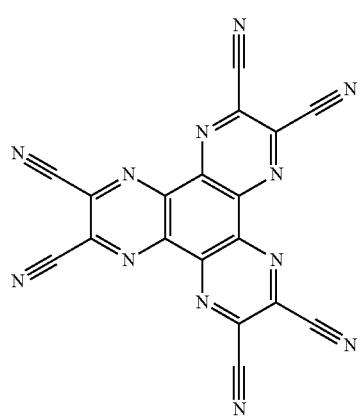

M-4

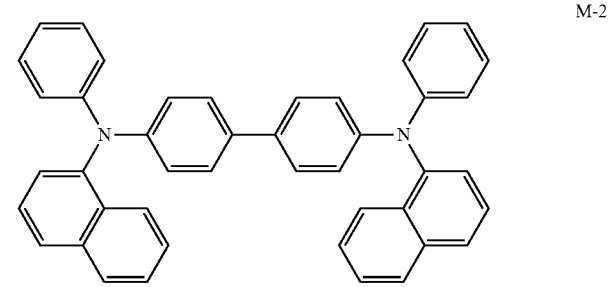

M-2

-continued

BD-1

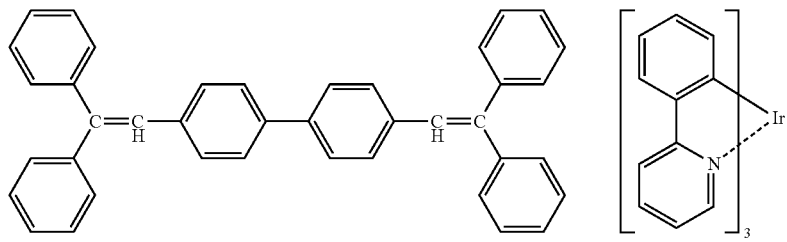

GD-1

RD-1

H-1

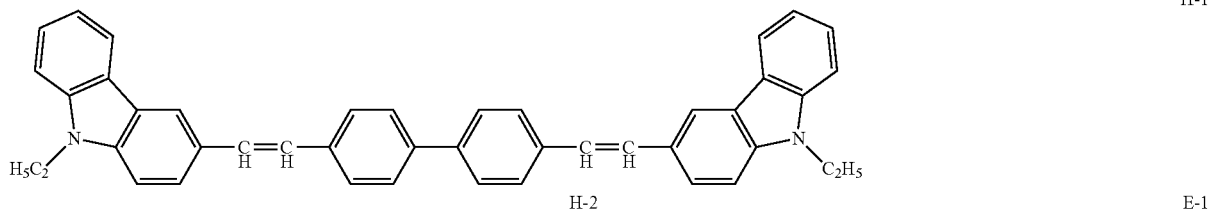

H-2

E-1

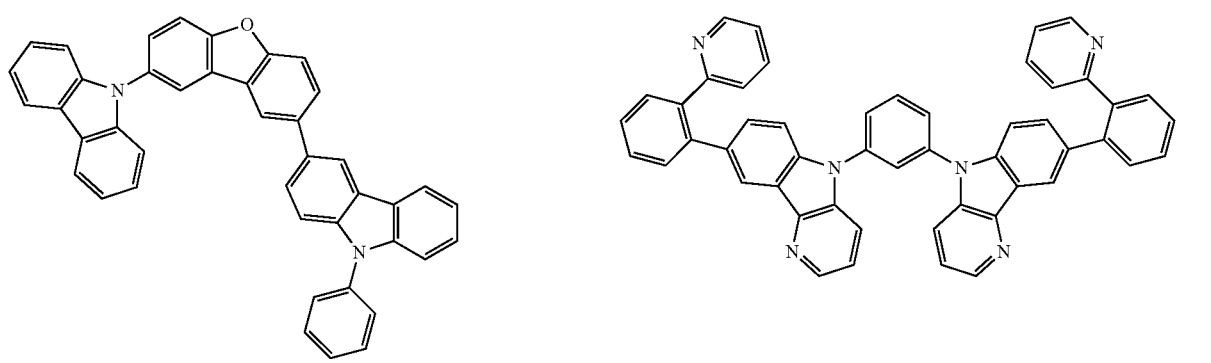

Subsequently, lithium was vapor deposited to form an intermediate metal layer having a thickness of 1.5 nm.

Subsequently, by using a shadow mask which can make patterning of the design of FIG. 2B, the compound M-4 was vapor deposited at a deposition rate of 0.1 nm/sec, and it was produced a layer having a thickness of 15 nm.

Subsequently, the compound M-2 was vapor deposited at a deposition rate of 0.1 nm/sec, and it was produced a layer having a thickness of 50 nm.

Subsequently, the compound BD-1, the compound GD-1, the compound RD-1, the compound H-1, and a compound H-2 were co-deposited at a deposition rate of 0.1 nm/sec so that the contents of the following compounds were made as follows: the compound BD-1: 5%, the compound GD-1: 17%, and the compound RD-1: 0.8%. Thus it was formed a second white light emitting layer having a thickness of 30 nm.

Subsequently, the compound E-1 was vapor deposited at a deposition rate of 0.1 nm/sec, and it was produced a layer having a thickness of 30 nm.

Further, after forming a LiF layer having a thickness of 1.5 nm, aluminum was vapor deposited with a thickness of 110 nm to form a cathode.

Subsequently, a non-light-emitting surface of the above-described element was covered with a glass case, whereby an organic EL element was produced.

Subsequently, the produced organic EL element as described above was covered with a glass case, and it was sealed in a glove box (under high purity nitrogen gas ambience at a purity of 99.999% or more) so that the organic EL element was not brought into contact with atmosphere.

Subsequently, a pattern mask and a UV absorbing filter (made by Isuzu Glass, Ltd.) were arranged by closely adhered with a reduced pressure on a surface of the substrate opposite to the surface on which were provided with the above-described various layers. UV rays were irradiated from the substrate side for 3 hours using UV Tester (SUV-W151: 100 mW/cm², made by Iwasaki Electric Co. Ltd.) to make a patterning.

Here, the UV absorbing filter having a light transmittance of 50% or less in the wavelength component of 320 nm or less was employed (cut wavelength: 320 nm).

It was confirmed that the produced organic EL element as described above exhibited different light-emitting patterns as illustrated in FIGS. 2A and B by independent driving of each light emitting unit.

INDUSTRIAL APPLICABILITY

The present invention can be suitably used for providing an organic EL element enabling to change a light-emitting pattern of high form accuracy without emission unevenness.

DESCRIPTION OF SYMBOLS

1: Organic EL element
2: Support substrate
4: Anode
4a: Taking-out electrode
6: Light emitting unit
6a and 6b: Hole injection layer
8: Intermediate metal layer
10: Light emitting unit
10a and 10b: Hole injection layer
12: Cathode
14: Laminated body
20 and 24: Non-irradiated region
22 and 26: Irradiated region
30: Organic EL module
32: Anisotropic conductive film
34: Flexible printed circuit
36: Adhesive
38: Polarizing member

The invention claimed is:

1. An organic electroluminescent element comprising a support substrate having thereon: at least two light emitting units each containing one or a plurality of organic functional layers; and at least one intermediate metal layer having a light-transmitting property, the intermediate metal layer being arranged between the light emitting units,
   wherein at least one organic functional layer in each light emitting unit has a region wherein a light emission function is modulated and another region wherein the light emission function is not modulated by being patterned with a mask during the step of forming the organic functional layer, and by being additionally patterned by light irradiation after formation of the organic functional layer; and
   the at least two light emitting units are able to be electrically driven independently or simultaneously.

2. An organic electroluminescent element described in claim 1, wherein the at least one organic functional layer is a hole transport layer or a hole injection layer.

3. An organic electroluminescent module having an organic electroluminescent element described in claim 1.

4. A method for producing an organic electroluminescent element comprising a support substrate having thereon: at least two light emitting units each containing one or a plurality of organic functional layers; and at least one intermediate metal layer having a light-transmitting property, the intermediate metal layer being arranged between the light emitting units,
   the method comprising the steps of:
   pattering at least one organic functional layer in each light emitting unit with a mask; and
   laying out a region wherein a light emission function is modulated and another region wherein the light emission function is not modulated by irradiation with light.

5. A method for producing an organic electroluminescent element described in claim 4, wherein the at least one organic functional layer is a hole transport layer or a hole injection layer.

6. An organic electroluminescent module described in claim 3, wherein a polarizing member, a half mirror member, or a black filter is provided on a light emitting surface side of the support substrate.

* * * * *